(12) United States Patent
Urano

(10) Patent No.: US 8,592,830 B2
(45) Date of Patent: Nov. 26, 2013

(54) LED UNIT

(75) Inventor: Youji Urano, Ikeda (JP)

(73) Assignee: Panasonic Corporation, Osaka (JP)

(*) Notice: Subject to any disclaimer, the term of this patent is extended or adjusted under 35 U.S.C. 154(b) by 3 days.

(21) Appl. No.: 13/264,188

(22) PCT Filed: Apr. 13, 2010

(86) PCT No.: PCT/JP2010/056613
§ 371 (c)(1),
(2), (4) Date: Oct. 13, 2011

(87) PCT Pub. No.: WO2010/119872
PCT Pub. Date: Oct. 21, 2010

(65) Prior Publication Data
US 2012/0032203 A1    Feb. 9, 2012

(30) Foreign Application Priority Data

Apr. 13, 2009  (JP) ................. 2009-097264

(51) Int. Cl.
  *H01L 29/18*   (2006.01)
  *H01L 33/00*   (2010.01)
  *H01L 27/15*   (2006.01)
  *H01L 21/00*   (2006.01)
(52) U.S. Cl.
  USPC .......... 257/81; 257/99; 257/E33.075; 257/88; 257/79; 438/122
(58) Field of Classification Search
  USPC .................. 257/88, E33.066, E33.075, 99
  See application file for complete search history.

(56) References Cited

U.S. PATENT DOCUMENTS

| | | | |
|---|---|---|---|
| 6,799,864 B2 | 10/2004 | Bohler et al. | |
| 2002/0176250 A1 | 11/2002 | Bohler et al. | |
| 2003/0178627 A1* | 9/2003 | Marchl et al. | 257/80 |
| 2007/0041190 A1 | 2/2007 | Chou | |
| 2007/0131958 A1* | 6/2007 | Hsu et al. | 257/99 |

(Continued)

FOREIGN PATENT DOCUMENTS

| | | |
|---|---|---|
| JP | 62-9287 U | 1/1987 |
| JP | 8-181380 A | 7/1996 |

(Continued)

OTHER PUBLICATIONS

International Search Report for the Application No. PCT/JP2010/056613 mailed May 18, 2010.

(Continued)

*Primary Examiner* — Jae Lee
*Assistant Examiner* — David Hoang
(74) *Attorney, Agent, or Firm* — McDermott Will & Emery LLP

(57) ABSTRACT

The LED unit 100 comprises a plurality of the LED module 1 and the heat radiation plate. Each the LED module 1 comprises the LED chip and the package for incorporating the LED chip therein; the package has the electrical insulation property. Each the package comprises the sub-mount member which is located between the LED chip and the heat radiation plate and which has heat conductivity; these are integrally formed. The LED modules are arranged on the first surface of the heat radiation plate. This configuration makes it possible for the LED unit to efficiently disperse the heat in the LED chip 10 to the heat radiation plate.

18 Claims, 16 Drawing Sheets

(56) References Cited

U.S. PATENT DOCUMENTS

| | | |
|---|---|---|
| 2007/0170452 A1 | 7/2007 | Kurokawa et al. |
| 2007/0201232 A1 | 8/2007 | Chen |
| 2007/0246715 A1* | 10/2007 | Shin et al. ............... 257/79 |
| 2008/0180015 A1 | 7/2008 | Wu et al. |
| 2008/0266869 A1* | 10/2008 | Tai et al. ............... 362/294 |
| 2009/0046456 A1 | 2/2009 | Urano et al. |
| 2009/0159905 A1* | 6/2009 | Chen ............... 257/88 |

FOREIGN PATENT DOCUMENTS

| | | |
|---|---|---|
| JP | 9-85986 A | 3/1997 |
| JP | 2003-101124 A | 4/2003 |
| JP | 2004-528698 A | 9/2004 |
| JP | 2006-269078 A | 10/2006 |
| JP | 2006-319290 A | 11/2006 |
| JP | 2006-351777 A | 12/2006 |
| JP | 2007-59371 A | 3/2007 |
| JP | 2007-234571 A | 9/2007 |
| JP | 2008-41684 A | 2/2008 |
| JP | 2009-64986 A | 3/2009 |
| JP | 2009-76326 A | 4/2009 |

OTHER PUBLICATIONS

Extended European Search Report issued in European Patent Application No. 10764456.9 dated Jul. 31, 2013.

* cited by examiner

LED UNIT

TECHNICAL FIELD

This invention relates to an LED unit which comprises a plurality of LED modules.

BACKGROUND ART

Conventionally, the discharge lamp and the laser oscillator are used as a light source, and the lighting device with the light source is produced. Recently, in order to achieve the low consumption of the electrical power and to improve the operating time of the lighting device, the LED unit with the LED modules (light emitting diode module) is produced instead of the discharge lamp.

The LED module comprises an LED chip and a package which houses the LED chip. The LED modules used to be combined with each other to produce light having an amount same as an amount of the prior lighting device such as discharge lamp. Japanese patent application publication No. 2004-528698A discloses the LED module which comprises a plurality of the LEDs. The LED module comprises the LEDs each of which are disposed on the sub-mount member having an electrical insulation property; the sub-mount member is disposed on the spreader having a heat conductive material. Each one of the LEDs of the LED module is connected to an electrical contact through a wiring. Japanese patent application publication No. 2007-234571A discloses a lighting apparatus which comprises a plurality of lighting unit and a printed circuit. In the lighting apparatus, the lighting units and the printed circuit are mounted on the heat radiation plate through the electrical insulation film; the heat radiation plate is made of metal material; the electrical insulation film has heat conductivity. Each one of the lighting units has the LED and a transparent cover which covers the LED. In the lighting apparatus, each one of the LEDs is electrically connected to the printed circuit through the wire which is provided by the wire bonding.

However, each one of the LED module and the lighting apparatus mentioned in the above is provided with the sub-mount member which mounts the LED chip, is provided with no LED module which is directly mounted on the heat radiation plate. In addition, the LED module requires the bonding wire for establishing the electrical connection with respect to the circuit of the substrate. The fact of employing the bonding wire causes the increase of the component count, and requires the great care. This results in the increase of the manufacturing cost. In addition, when manufacturing the LED module, there is a possibility of the breakage of the wire bonding due to the contact with respect to something.

DISCLOSURE OF THE INVENTION

This invention is achieved in view of the above problem. An object of this invention is to produce the LED unit which enables the LED module to establish the electrical connection with respect to the circuit (wiring) of the outside without using the wire bonding.

The LED unit in this invention comprises a plurality of the LED modules and the heat radiation plate. In addition, each the LED module comprises the LED chip and the package. The package is shaped to incorporate the LED chip therein. The package is made of an electrical insulation property. Each the package has a certain portion between the LED chip and the heat radiation plate, and comprises a sub-mount member located in the certain portion. The sub-mount member has heat conductivity. The sub-mount members are integrally formed with each other, whereby the sub-mount member is single. These LED modules are arranged on the first surface of the heat radiation plate. This configuration makes it possible for the LED unit 100 to release the heat in the LED chip 10 to the heat radiation plate 40, efficiently.

The LED unit preferably comprises the following configurations. Each the LED module is provided at its outer surface with a positive terminal and a negative terminal. The positive terminal is electrically connected to the anode of the LED chip. The negative terminal is electrically connected to the cathode of the LED chip. The heat radiation plate is provided at its first surface with an electrical insulator. The electrical insulator is located next to the LED module. The electrical insulator is provided at its first surface with a patterned circuit. The patterned circuit is configured to establish the electrical connection of connecting a plurality of the LED modules to each other. The patterned circuit is formed with a plurality of the pads which is connected to the terminal of each the LED module with solder. This configuration makes it possible to establish the electrical connection of the LED module to the patterned circuit by means of simple solder connection, without using the wire bonding.

It is preferred that the positive terminal and the negative terminal are formed on the first surface of the LED module. This configuration makes it possible to make a solder connection to single surface. Therefore, it is possible to easily establish the electrical connection. Instead of the above, it is preferred to form the positive terminal and the negative terminal to the first surface and the second surface of the LED module, respectively.

Furthermore, in the LED module, it is preferred that at least one of the positive terminal and the negative terminal is realized by a plurality of the positive terminal or a plurality of the negative terminal. In addition, the patterned circuit is preferably configured to establish the parallel connection or series connection of a plurality of the LED modules. This configuration makes it possible to establish the connection of the LED modules by the various methods.

In addition, it is preferred that the electrical insulator is realized by a pair of the electrical insulators which is formed on the first surface of the heat radiation member. The electrical insulators are spaced from each other. The LED module is disposed between the electrical insulators which are paired. The electrical insulators are provided at its first surface with the patterned circuit, respectively.

When a plurality of the LED modules are arranged to have a parallel connection, it is preferred to further comprise the following technical feature. The patterned circuit is realized by a plurality of wiring lines which extend along a direction of a long side of the first surface of the electrical insulator. A plurality of the LED module is electrically connected to the wiring lines through the positive terminal and the negative terminal. This configuration makes it possible to connect a plurality of the LED module by a various method.

When a plurality of the LED module is arranged to have a parallel connection, it is preferred further employ the following configurations. A plurality of the wiring line comprises a wiring line of positive side and a wiring line of negative side. The wiring line of positive side is connected to the positive terminal of each the LED module. The wiring line of negative side is connected to the negative terminal of each the LED module. Furthermore, it is preferred that the wiring line of positive side and the wiring line of negative side are formed on the electrical insulator which is single. More preferably, a part of the patterned circuit is formed in an inside of the electrical insulator. With this configuration, a plurality of the wiring lines and a plurality of the terminals are connected on the electrical insulator which is single. Therefore, it is possible to easily make a solder connection. Consequently, it is possible to reduce the manufacturing cost.

Furthermore, it is preferred to comprise the following configurations. The electrical insulator is realized by a pair of the electrical insulators. The electrical insulators are disposed on the first surface of the heat radiation plate, and are spaced from each other. The LED module is disposed between the electrical insulators which are paired. The wiring line of the positive side and the wiring line of the negative side are formed on the electrical insulators which are paired, respectively. Consequently, it is possible to establish the connection of a plurality of the LED module by various methods.

Furthermore, It is preferred that the positive terminal and the negative terminal of the LED module have the same levels with respect to each other. This configuration makes it possible to easily establish the electrical connection of the terminals to the pads with using a little amount of the solder.

Furthermore, it is preferred that the electrical insulator has a second surface which is faced to the LED module, and is provided with an extending member which extends from the second surface. The extending member is overlapped with the third surface of the LED module. In this case, the extending member has the first surface which is overlapped with the third surface of the LED module. The first surface of the extending member is defined as a space for spreading the solder having the liquid form when the solder having the liquid form flows to the surface of the LED module and the electrical insulator. That is, the extending member makes it possible to prevent the electrical short which is caused by the fact that the solder having the liquid form flows to the first surface of the heat radiation plate.

Furthermore, it is preferred that the electrical insulator is provided at its third surface with a projection which projects toward the LED module. The LED module is formed with a recess which is engaged with the projection. This configuration makes it possible to make a positioning of each the LED module.

Furthermore, it is preferred that the LED module comprises the pads which are provided to the projections. The terminal is exposed such that the terminal is faced to the wall surface of the recess. With this configuration, it is possible to make a positioning. In addition, it is possible to connect the terminal and the pad with a little amount of the solder.

It is preferred that each the LED module has a fourth surface which is configured to pass the light emitted from the LED chip. A plurality of the LED modules are arranged along a direction of a short side of the fourth surface. This configuration makes it possible to increase the intensity of the light emitted from the LED unit 1.

It is preferred that the LED module is connected to the first surface of the heat radiation plate with braze or the adhesive agent having the heat conductivity. This configuration makes it possible to omit the screw hole from the LED module. In addition, this configuration makes it possible to connect the LED module to the heat radiation plate while keeping high heat conductivity. Furthermore, it is possible to downsize the LED module. Therefore, it is possible to mount the LED module with high-density packaging.

Furthermore, it is preferred that the heat radiation plate comprises a mounting base and a pedestal. A plurality of the LED modules are mounted on the mounting base. The pedestal is detachably attached to the mounting base. With this configuration, it is possible to only replace the mounting base with the LED modules, independent from the pedestal, when the LED module is replaced. Therefore, it is possible to perform the replacement easily.

In addition, it is preferred to employ the following configuration, in addition to the LED unit comprises the LED chip, the package which incorporates the LED chip therein, and the heat radiation plate. The first surface of the heat radiation plate is provided with an electrical insulator with a patterned circuit. The patterned circuit and the LED module are connected by the wire. This configuration makes it possible to electrically connect the LED module to the patterned circuit.

BRIEF EXPLANATION OF THE DRAWINGS

FIG. 2 A shows the perspective view of the package when seen from the top side of the package.

FIG. 2 B shows one example of the package of the LED unit of the above. FIG. 2 shows the bottom view of the package when seen from the bottom side of the package.

FIG. 2 C shows another example of the package in the LED unit of the above. FIG. 2 C shows the perspective view of the package when seen from the top side of the package.

FIG. 2 D shows another example of the package in the LED unit of the above. FIG. 2 D shows the bottom view of the package when seen from the bottom side of the package.

FIG. 6 B shows a circuit diagram indicating another connection relationship between the terminal and the LED chip in the LED unit of the above.

FIG. 8 B shows a circuit diagram indicating another connection relationship between the terminal and the LED chip in the LED unit of the above.

BEST MODE FOR CARRYING OUT THE INVENTION

Hereinafter the explanation of the embodiment of this invention is made with attached drawings.

First Embodiment

Figure 1:
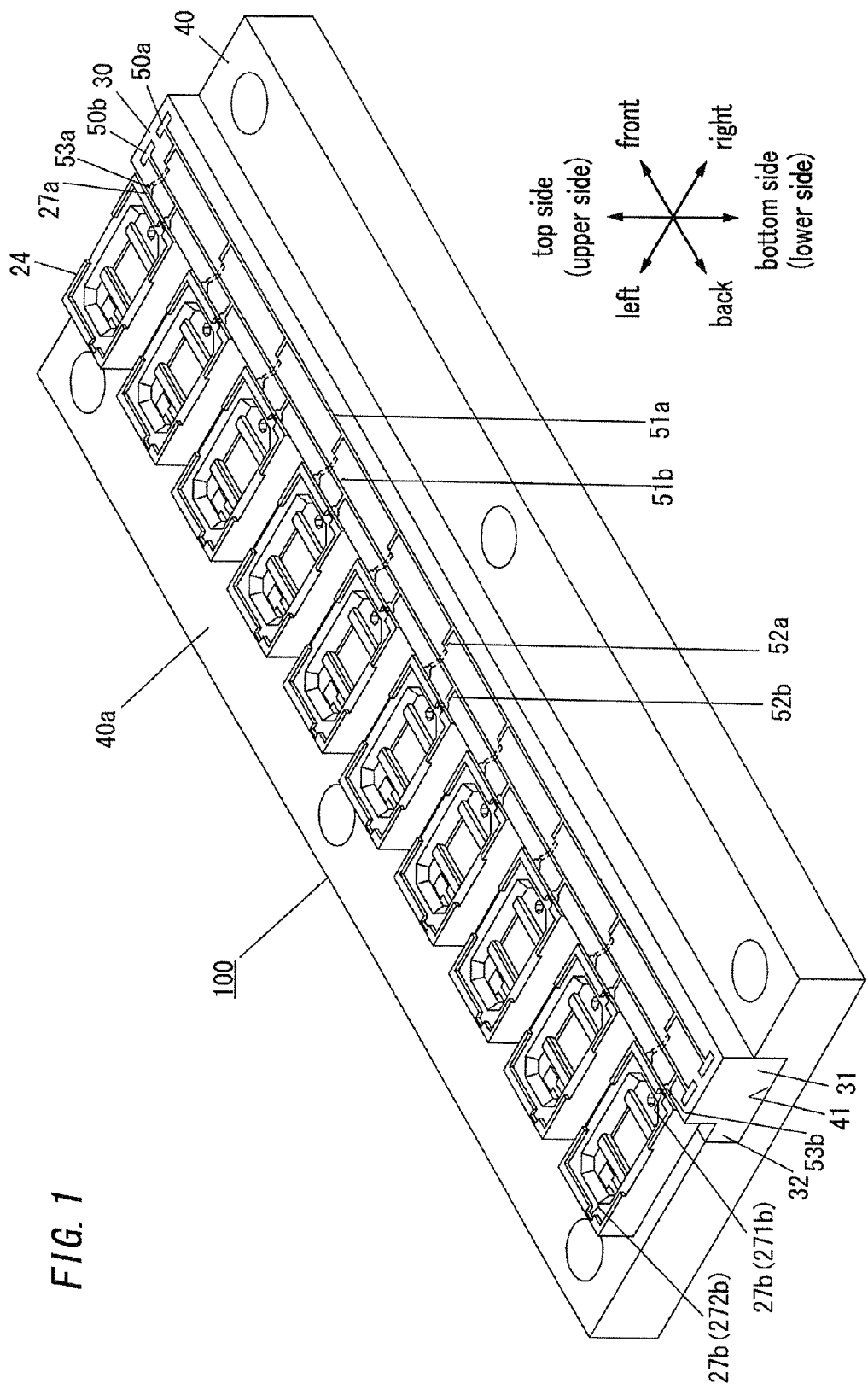
FIG. 1 shows a perspective view of the LED unit in the first embodiment.

The first embodiment discloses the LED unit 100; the LED unit 100 comprises a plurality of the LED modules 1, an electrical insulator 30, and a heat radiation plate 40 shown in FIG. 1; the LED module 1 has an approximately cuboid; the electrical insulator 30 has an approximately cuboid; the heat radiation plate 40 has an approximately cuboid. The electrical insulator 30 is provided at its first surface with a wiring line (patterned circuit) 50 which is formed to establish the electrical connection of a plurality of the LED modules 1 with each other. (In this embodiment, the first surface of the electrical insulator 30 is defined by a top surface of the electrical insulator 30.) The wiring line 50 comprises a wiring line 50a of negative side and a wiring line 50b of positive side. Hereinafter, explanations of the direction indicated in FIG. 1 are made. The upper-lower direction is defined by the thickness direction of the heat radiation plate 40. Each one of the LED module 1 is mounted on the top surface (first surface) 40a of the heat radiation plate 40. The longitudinal direction of the heat radiation plate 40 is defined as a front-back direction. (The longitudinal direction of the heat radiation plate 40 is defined by the arrangement direction that a plurality of the LED module 1 are arranged.) The lateral direction is defined as a direction perpendicular to the upper-lower direction, and also perpendicular to the front-back direction. In addition, an upper side of the heat radiation plate 40 which mounts each the LED module 1 is defined as a front side of the LED unit 100 in a condition where the LED unit 100 is used.

The heat radiation plate 40 is provided at its top surface with a groove 41 which extends in a front-back direction. The groove 41 is formed such that a part of the electrical insulator 30 is disposed within the groove 41. The top surface of the heat radiation plate 40 mounts the LED module 1 such that the LED module 1 is located in a left side of the groove 41.

The electrical insulator 30 comprises a main member 31 and an extending member 32. The electrical insulator 30 has a cross section which is perpendicular to the front-back direction. The cross section of the electrical insulator has L-shape. The main member 31 has a top surface for mounting the wiring line 50. The extending member 32 is formed to project from a lower portion of the second surface of the main member. (The second surface of the main member 31 is defined by a left side surface of the main member 31 in this embodiment.) In this embodiment, the main member 31 has the top surface which is defined as the first surface of the electrical insulator 30, and has the left side surface which is defined as the second surface. "The lower portion of the main member 31" and "the extending member 32" are disposed within the groove. The extending member 32 has the top surface, and is configured to mount the right end portion of the third surface 1c of each the LED module 1. (The third surface of each the LED module 1 is defined by the bottom surface of the LED module in this embodiment.)

That is, each the LED module 1 is supported by "the extending member 32 of the electrical insulator 30" and "the heat radiation plate 40". A plurality of the LED modules 1 are spaced from each other to have a predetermined clearance between them, and are arranged in a row along a longitudinal direction of the electrical insulator 30.

Figure 3:
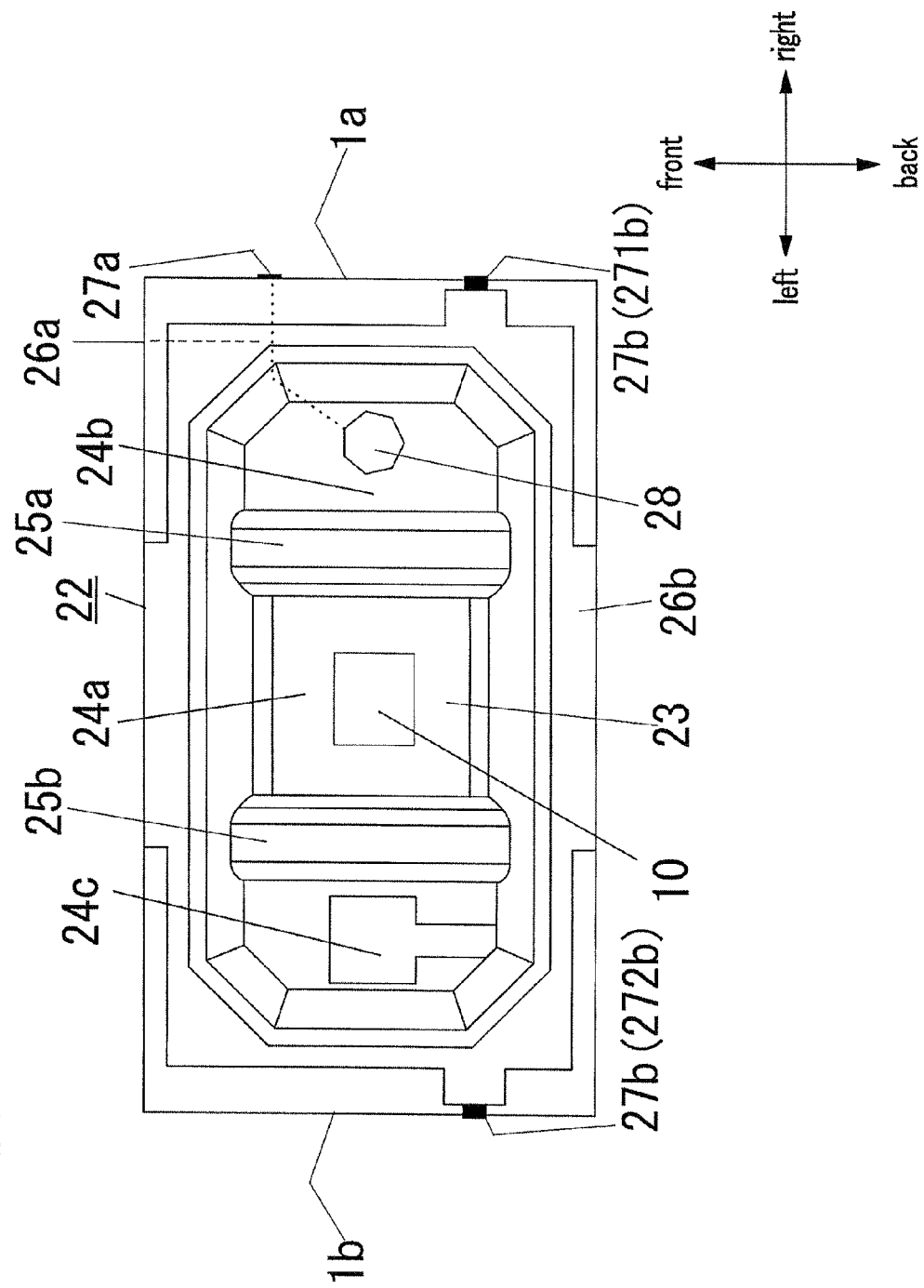
FIG. 3 shows a perspective view indicating the internal configuration of the package in the LED unit of the above.

As shown in FIG. 1 and FIG. 3, the LED module 1 comprises an LED chip 10 and a package 20 which is made of material having an electrical insulation property and which is configured to house the LED chip 10. The LED chip 10 is mounted on the bottom of the package such that a cathode of the LED chip 10 is located on the top side and an anode of the LED is located on the bottom side. In this invention, the arrangement of the LED chip 10 is not limited to the above. That is, the LED chip 10 may be mounted such that the anode of the LED chip is located on the top side and the cathode of the LED is located on the bottom side. Each one of the packages 20 is, as shown in FIG. 3, shaped to have a rectangular shape in the planar view. Each one of the package comprises a cover 21 (not shown in FIG. 1) and the housing 22. The cover 21 is made of the light transmissive material such as glass, and is shaped to have a truncated pyramid. The cover 21 is formed at its bottom surface with an opening, and is configured to pass the light emitted from the LED chip 10. The top surface of the cover 21 is defined as the fourth surface (top surface) 1d of the LED module 1. The cover is attached at its circumference of the lower surface to the circumference of the top surface of the housing 22.

The housing 22 is made of material such as MID and laminated body. (MID is a molded interconnect device which is made of a plurality of material having a high electrical insulation property and high heat conductivity. The laminated body is exemplified by an LTCC (Low temperature co-fired ceramics).) In addition, the housing 22 is integrally formed with the sub-mount member 22a which has an electrical insulation property and the heat conductivity. The sub-mount member 22a is disposed on the bottom of the housing 22 such that the sub-mount member 22a is located between the LED chip 10 and the heat radiation plate 40. (That is, the sub-mount member 22a is disposed on the bottom of the package.) That is, the LED chip 10 is mounted on the top surface 40a of the heat radiation plate 40 through the sub-mount member 22a. It is noted that the sub-mount member is made of material such as AlN (aluminum nitride) and the LTCC. According to the arrangement of the LED chip 10, the heat radiation plate 40, and the sub-mount member 22a located between the LED chip 10 and the top surface of the heat radiation plate 40, each the LED module 1 is directly mounted on the heat radiation plate 40. This configuration makes it possible to immediately release the heat of the LED chip 10.

The housing 22 is provided at its outer surface with a negative terminal 27a and the positive terminal 27b (271b, 272b). (That is, each one of the LED module 1 is provided at its outer surface with the negative terminal 27a and the positive terminal 27b.) The negative terminal 27a and the positive terminal 27b are exposed, and are connected to the wiring line 50a of the negative side 50a and the wiring line 50b of the positive side 50b, respectively. In this embodiment, a plurality of the positive terminal 27 is employed. (In this embodiment, two positive terminals 27 are employed.) However, the one positive terminal may be employed in this embodiment.

The housing 22 has an outer surface which comprises the first surface, the second surface, and the third surface. (In other words, each one of the LED modules 1 has an outer surface which comprises the first surface, the second surface, and the third surface.) The first surface is faced to the electrical insulator 30. (The first surface is defined by the right side surface in this embodiment. The second surface is defined by the left side surface in this embodiment. The third surface is defined by the bottom surface in this embodiment.) The first surface, the second surface, and the third surface of the housing 22 are defined as the first surface 1a, the second surface 1b, and the third surface 1c of the LED module 1, respectively.

Each one of the LED modules 1 (in other words, the housing 22) is provided at its right side surface 1a with the negative terminal 27a and the positive terminal 271b. Each one of the LED modules 1 (in other words, housing 22) is provided at its left side surface with a negative terminal 272b. In this embodiment, the positive terminal 272b is not connected to the pad 53 with the solder.

In addition, as shown in FIG. 1, a plurality of the LED modules 1 have the top surface which passes the light, and are arranged in a direction of short side of the top surface. According to this arrangement, it is possible to increase the intensity of the light emitted from the LED unit 1.

FIG. 3 shows the internal structure of the housing 22 of the LED module. The housing 22 is shaped to have a cuboid and is provided at it upper portion with an opening. The center of the inside bottom of the housing 22 is provided with a recess 23 which is upwardly opened. The recess 23 is shaped to have a truncated eight-sided pyramid. The recess 23 is provided at its center of the inside bottom with a first land 24a, the second land 24b, and the third land 24c which are made of electrical conductive member. The first land 24a has a rectangular shape, and is electrically connected at its top surface to the LED chip 10 with die bond. As mentioned above, the LED chip 10 of this embodiment is arranged such that the cathode is located on the top surface and the anode is located on the bottom surface. Therefore, the anode of the LED chip 10 is electrically connected to the first land 24a. In addition, the left side and the right side of the first land 24a are provided with the second land 24b and the third land 24c, respectively. In addition, the left side and the right side of the first land 24 are provided with a hump 25a and a hump 25b, respectively. The hump 25a is located between the first land 24a and the second land 24b. The hump 25a is electrically connected to the second land 24b through the patterned conductor (not shown in the illustration). The hump 25b is located between the first land 24a and the third land 24c. In addition, the second hump 25a, 25b are electrically connected to each other through the patterned conductor (not shown in the illustration).

The hump 25 is electrically connected to the top surface of the LED chip 10 through the bonding wire (not shown). That is to say, the cathode of the LED chip 10 is electrically connected to the second land 24b through the bonding wire (not shown), the hump 25a, and the patterned conductor (not shown). In addition, the second land 24b is provided with a via-hole which has an inside wall coated with the electrical conductive member. (The via hole is such as the through hole for conductive paste.) The via hole 28 extends linearly toward a lower direction of the housing 22 from the second land 24b. The via hole 28 is electrically connected at its lower end with the lower side patterned conductor 26a which is provided on the lower surface of the housing 22. The lower side patterned conductor 26a has one end which is located on the side surface 1a, 1b of the housing 22. The one end of the lower side patterned conductor 26a is defined as the negative terminal 27a on the side surface of the housing 22, and is exposed.

As one example of the package 20, the negative terminal 27a is arranged such that the negative terminal 27a is exposed over an area from the top end of the side surface of the housing 22 to an approximately center of the housing 22. In addition to the above, the lower side patterned conductor 26a is formed on an inside of an inside wall of the housing 22. FIG. 2A and FIG. 2B shows the planar view of the package and the bottom view of the package, respectively.

As another example of the package 20, the negative terminal 27a is arranged to be exposed over an area from the top end of the side surface of the housing 22 to the lower end of the side surface of the housing 22. In addition to the above, the lower side patterned conductor 26a is arranged at a bottom surface 1c of the housing 22 such that the lower side patterned conductor 26a is exposed. FIG. 2C and FIG. 2D shows the planar view of the package and the bottom view of the package. In addition, when the lower side patterned conductor 26a is arranged on the bottom surface of the housing 22 such that the lower side patterned conductor 26a is exposed, there is a necessity of preventing the electrical short of the lower side patterned conductor 26a and the heat radiation plate 40. In this case, the extending member 32 is disposed on the electrical insulator 30, necessarily. In addition, the via hole 28 extends from the second land 24b to the bottom surface 1c of the housing 22 through the inside wall of the housing 22.

In each example, each the negative terminal 27a is electrically connected to the cathode of the LED chip 10 through the lower side patterned conductor 26a, the via hole 28, the second land 24b, the patterned conductor (not shown), and the bonding wire (not shown). In addition, as shown in FIG. 2B and FIG. 2D, the LED chip 10 has a top surface of the bottom of the housing 22. (The top surface of the bottom of the housing 22 corresponds to the rear surface of the plane of the paper.) In addition, the top surface of the bottom of the housing 22 has a predetermined region having the rectangular shape indicated by the dot-line. The LED chip 10 is mounted on the predetermined region. That is, the above sub-mount member 22a is mounted on the region of the rectangular shape indicated by the dot line in FIG. 2B (FIG. 2D) of the bottom of the housing 22. Hereinafter, an explanation of a case where the lower side patterned conductor 26a is disposed on an inside of the bottom wall of the housing is made. (That is to say, an explanation of a case where the configuration indicated by FIG. 2A and FIG. 2B is employed is made.)

The zener diode (not shown) is mounted on the third land 24c. The first land 24a and the top side patterned conductor 26b are electrically connected to each other through the patterned conductor. The zener diode is electrically connected to the third land 24c through the die bond. Consequently, the zener diode is electrically connected to the hump 25b through the die bond. The hump 25b is electrically connected to the top surface of the LED chip 10 through the bonding wire (not shown). That is, the zener diode is connected in parallel with the LED chip 10.

Figure 4:
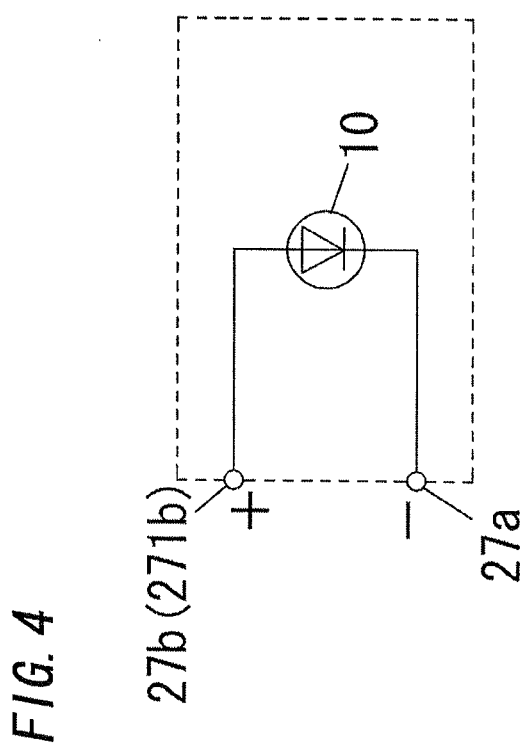
FIG. 4 shows a circuit diagram indicating the connection relationship between the terminal and the LED chip in the LED unit of the above.

The housing 22 is provided at its top surface with a predetermined portion which is defined by the circumference of the recess 23 and a part of the side wall of the recess 23, and is provided at its predetermined portion with the top side patterned conductor 26b. The patterned conductor of the top surface side is formed to have an approximately T-shape. The patterned conductor of the top surface side is connected at its one end with the first land 24a. The remaining two ends are electrically connected to the positive terminals 27b (271b, 272b). That is, each the positive terminal 27b is electrically connected to the anode of the LED chip 10 through the top side patterned conductor 26b and the first land 24a. FIG. 4 shows the circuit diagram which indicates the connection relationship between "the LED chip 10" and "the terminals 27a, 27b (271b)" of the LED unit in this embodiment.

The positive terminal 27b is faced to the circuit (patterned circuit) 50b, and exposed to the outside from the right side surface 1a. The positive terminal 27b is connected to the circuit (patterned circuit) 50b with solder.

Figure 2:
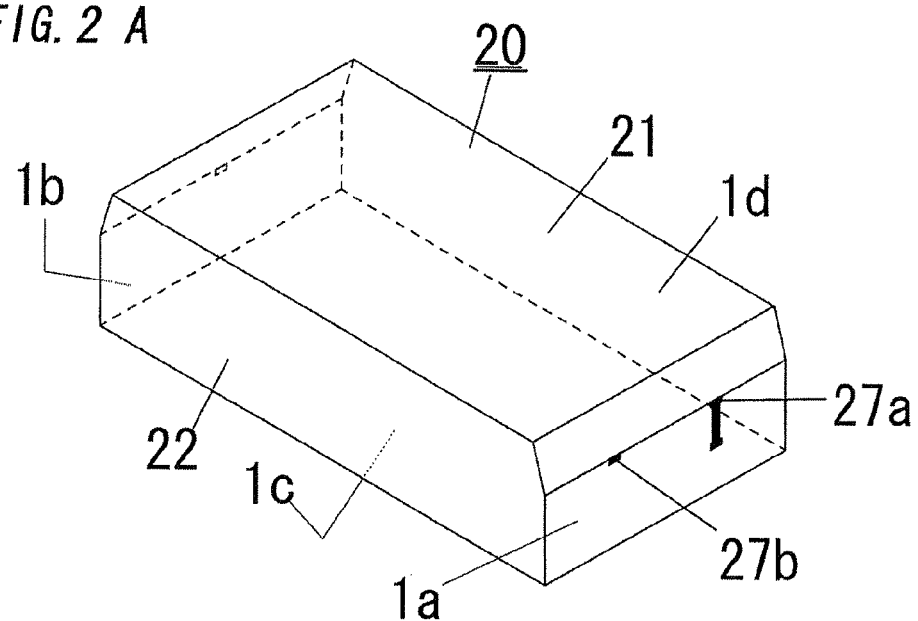
FIG. 2 A shows one example of a package in the LED unit of the above.
Figure 2:
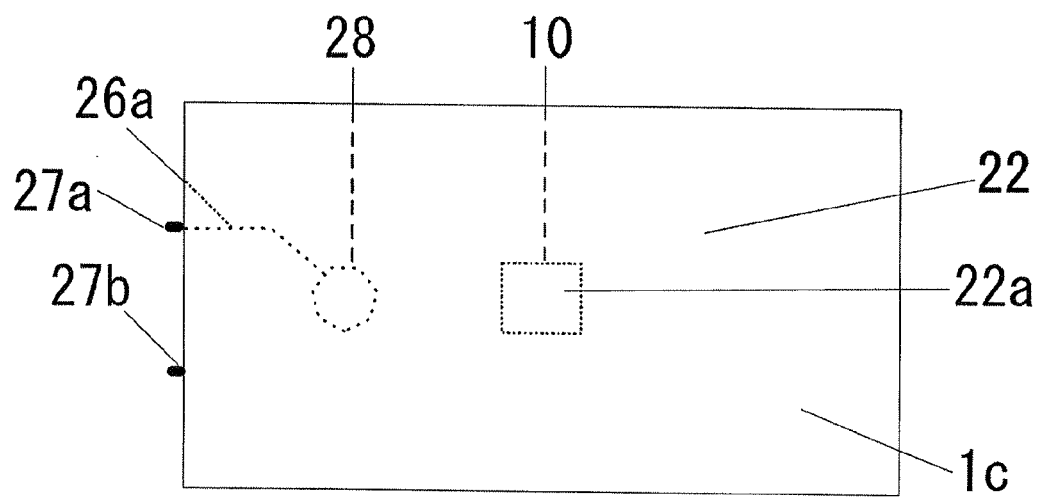
Figure 2:
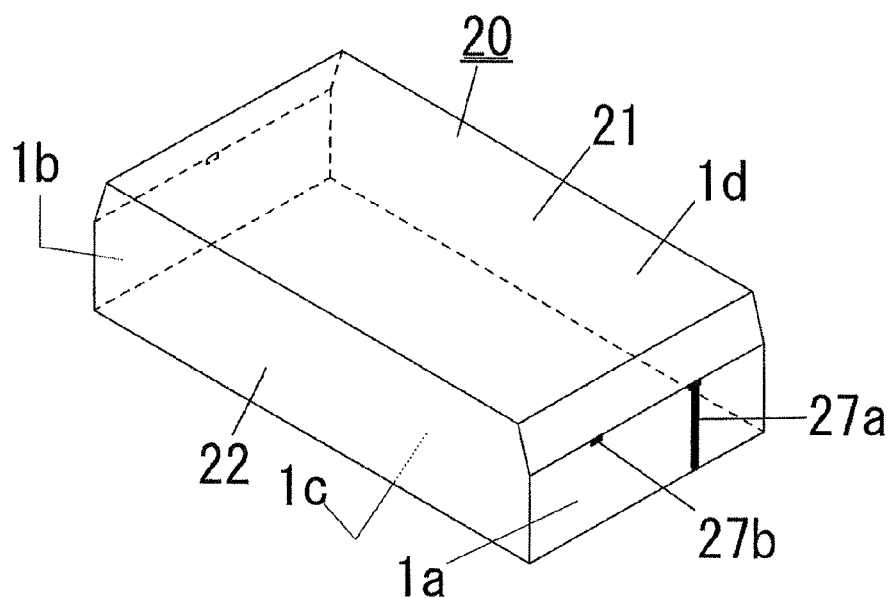
Figure 2:
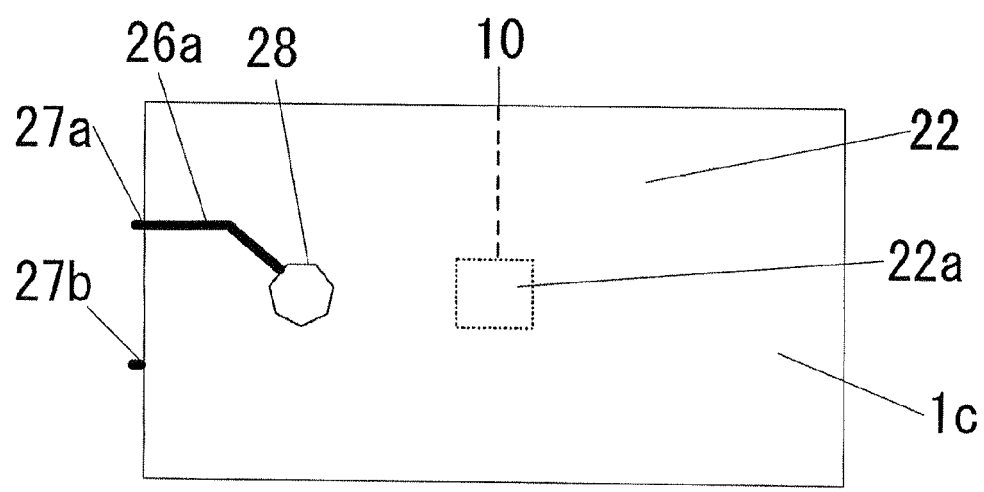

As explained in the above, the negative terminal 27a is electrically connected to the cathode of the LED chip 10 through "the via-hole 28 having the inside wall coated with the electrical conductive member", and "the bonding wire (not shown)". The negative terminal 27a is faced to the circuit (patterned circuit) 50a, and is exposed to the outside from the right side surface 1a of the housing 22. As shown in FIG. 2 A and FIG. 2 C, this embodiment discloses the negative terminal 27a which has a shape like strip extending in upper-lower direction. The upper end of the negative terminal 27a has a semicircle shape. In addition, in this embodiment, the negative terminal 27a is not limited to this shape. For example, the negative terminal 27a may have the upper end having a rectangular shape.

The electrical insulator 30 has a main member 31 which has a top surface, and is provided at its top surface with two wiring lines 50. Each the wiring lines 50 (which is realized by the wiring line 50a of the negative side and the wiring line 50b of the positive side) are provided with main line 51 (51a, 51b), a plurality of branch lines 52 (branch line 52a, 52b), and a plurality of the pads 53 (53a and 53b). Each pad 53 has the semicircular shape in this embodiment. However, the shape of the pad is not limited thereto. For example, each the pad 53 has a rectangular shape.

Each the main line 51 is connected to the external power source (not shown). The main line 51 is disposed on the top surface of the electrical insulator 30 such that the main line 51 extends in the front-back direction. Each the branch line 52 extends in the lateral direction so as to extend to the LED module 1 from the main line 51.

In this embodiment, each the pad 53 is formed at its one end of each the branch line 52. Each the pad 53 is connected to each the terminal 27 on the right side surface 1a of the LED module 1 with the solder. In addition, a part of the branch line 52a of the wiring line 50a of the negative side is embedded in the electrical insulator 30.

In this embodiment, the thickness of the electrical insulator 30 is set such that "each the terminals 27a exposed to the outside" and "each the pads" are located on the same level (on the same height) with respect to each other. "The upper end of each the negative terminal 27a" and "each the pad 53a" have the same level (same height). "The upper end of each the positive terminal" and "each the pad 53b" have the same levels (the same heights).

According to this designing, each the terminal 27 and each the pad 53 are connected to each other with a little amount of the solder, without bonding wire. Therefore, it is possible to easily establish the parallel connection of a plurality of the LED modules. In this embodiment, each the terminal 27 and each the pad 53 are connected with solder by means of the reflow method of heating the heat radiation plate 40 from the lower surface after the solder paste is applied to the top of each the pad 53.

As mentioned above, the electrical insulator 30 is provided with an extending member 32 which extends from the lower portion of the second surface of the main member 31. (The extending member 32 extends from the lower side surface of the right side surface in this embodiment.) If the solder is heated to be varied into a liquid form and flows to "the right side surface of the LED module 1" or "top portion of the left side surface of the main member 31 of the LED module", the top surface of the extending member 32 provides a space for spreading the solder having the liquid form. That is, the extending member 32 prevents the solder having the liquid form from flowing to the top surface of the heat radiation plate 40. Consequently, it is possible to prevent the electrical short.

However, if there is no possibility of the electrical short of "the patterned conductor 26a" and "the lower side and the heat radiation plate 40" and also there is no possibility of the electrical short due to the solder having the liquid form for connecting each the terminal 27 and each the pad 53 with a little amount of the solder, it is possible to omit the extending member 32. When the extending member 32 is omitted, the groove 41 of the heat radiation plate 40 is designed to have a size for incorporating the lower portion of the main member 31 of the electrical insulator 30. An entire of the bottom 1c of each the LED module 1 is mounted on the top surface 40a of the heat radiation plate 40.

In addition, already mentioned in the above, the LED chip 10 may be arranged such that the anode is located on the top surface and the cathode is located on the bottom surface. In this case, each the LED module comprises the positive terminal which is indicated by the terminal with the reference numeral of "27a", and the negative terminal which is indicated by the terminal with the reference numeral of "27b". In addition, the wiring line of the electrical insulator 30 comprises the wiring line of the positive side symbolized by the reference numeral of 50a, and the wiring line of the positive side symbolized by the reference numeral of 50b. In addition, the negative terminal 27b and the positive terminal 27a are connected to the pad 53b and 53a, respectively, with the solder.

In addition, in this embodiment, each the LED module 1 is provided with one negative terminal 27a. However, the number of the negative terminal 27a is not limited to one, whereby the LED module may comprise a plurality of the negative terminal 27a. For example, when two negative terminals 27a are employed, one of the two negative terminals 27a is disposed on the first surface 1a of each the LED module 1, and the other of the two negative terminals 27a is disposed on the second surface 1b of each the LED module 1. (One of the two negative terminals 27a is disposed on the right side surface of the LED module 1 (housing 22), and the other of the two negative terminals 27a is disposed on the left side surface of the LED module 1 (housing 22).) In this case, the lower side patterned conductor 26a extends from the lower end of the via hole 28 toward both the left side surface 1a and also the right side surface 1b of the LED module 1. In addition, the negative terminal 27a is exposed to the outside from the left side surface 1a and the right side surface 1b of each the LED module. As explained below, "the technical feature that each the LED module 1 comprises the negative terminals 27a and the positive terminals 27b" makes it possible to electrically connect a plurality of the LED module 1 by various method.

Second Embodiment

Figure 5:
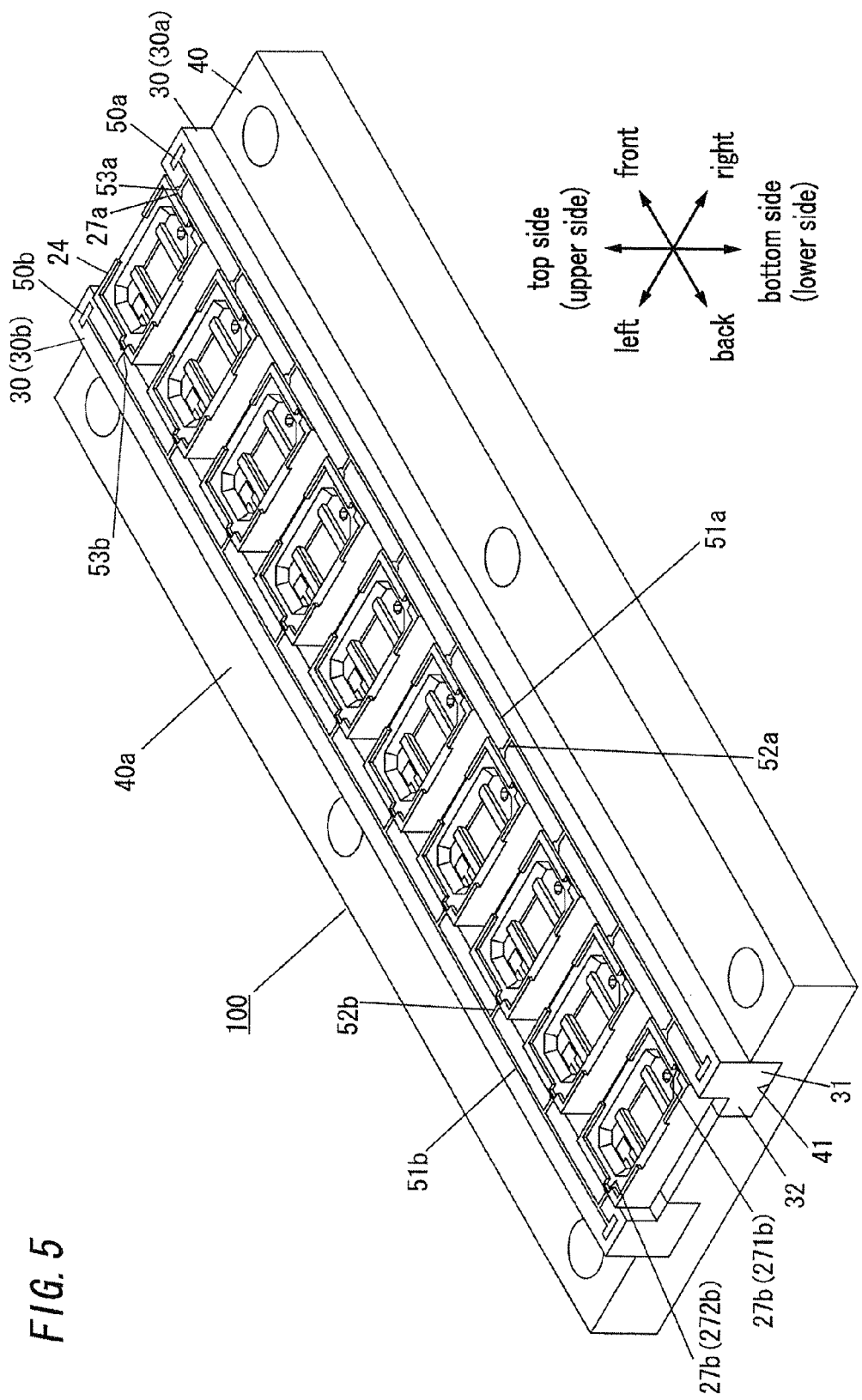
FIG. 5 shows a perspective view of the LED unit of the second embodiment.

FIG. 5 shows the LED unit 100 of this embodiment. The LED unit 100 of this embodiment has basic components which are approximately in common with the basic components of the first embodiment. Therefore, the components in common with the components in the first embodiment are symbolized by the same reference numerals, whereby the explanation is omitted. In this embodiment, the number of the grooves 41 of the heat radiation plate 40, the number of the electrical insulator 30, and the connection portion by means of the solder are different from the first embodiment.

In this embodiment, the heat radiation plate 40 is provided at its top surface with two grooves. The heat radiation plate 40 is provided at its top surface 40a with two electrical insulators 30 (30a, 30b) which are disposed within the two grooves 41, respectively, formed on the top surface 40a. The two electrical insulator 30a, 30b are mounted on the left side of the top surface of the heat radiation plate 40 and the right side of the top surface of the heat radiation plate 40 such that each the LED module 1 is interposed between the two electrical insulator 30a, 30b. Each the electrical insulator 30 comprises the main member 31 for mounting the wiring line 50, and the extending member 32 which extends from the lower portion of the second surface of the main member 31. The two electrical insulators 30a, 30b are provided at their top surfaces (at their first surfaces) with the wiring line 50a of negative side and the wiring line 50b of positive side. In addition, in this embodiment, the left side surface of the main member 31 of the electrical insulator 30a and the left side surface of the main member 31 of the electrical insulator 30b are defined as the second surface.

The configuration of the LED module 1 in this embodiment is approximately equal to the configurations of the LED module 1 of the first embodiment. That is, in the LED module 1, the negative terminal 27a and the positive terminal 271b are located on the right side surface which is faced to the electrical insulator 30a. The negative terminal 27a and the positive terminal 271b are exposed. The positive terminal 272b is located on the left side surface which is faced to the electrical insulator 30b. The positive terminal 272b is exposed.

Each the pad 53a of the wiring line 50a of the negative side is formed on the electrical insulator 30a such that "each the pads 53a" and "the negative terminal 27a of the LED module 1" have the same levels (the same height). Each the pads 53b of the wiring line 50b of the positive side is formed on the electrical insulator 30a such that each the pads 53b of the wiring line 50b and each the positive terminal 272b of the LED module 1 have the same levels (the same heights). In this embodiment, each the negative terminal 271b is not connected to the pad 53 with the solder. FIG. 6A shows the circuit diagram which indicates the connection relationship of "the LED chip 10" and "the terminals 27a, 27b (271b, 272b)" of the LED unit 100 of this embodiment.

With this configuration, similar to the first embodiment, it is possible to connect each the terminal to each the pad 53 with a little amount of the solder, without using the bonding wire. Therefore, this configuration makes it possible to easily establish the parallel connection of a plurality of the LED module. Similarly, the top surface of the extending member 32 of the electrical insulator 30 provides a space for spreading the solder having the liquid form. Therefore, it is possible to prevent the flowing of the solder having the liquid form to the top surface of the heat radiation plate 40. Therefore, it is possible to prevent the electrical short. In addition, similar to the first embodiment, when "there is no possibility of the electrical short between the patterned conductor 26a of the lower side and the heat radiation plate 40", "it is possible to connect each the terminal 27 and each the pad 53 with a little amount of the solder", and "there is no possibility of the electrical short according to the connection of the each the terminal 27 and each the pad 53 with solder having the liquid form", it is possible to omit the extending member 32.

Figure 6:
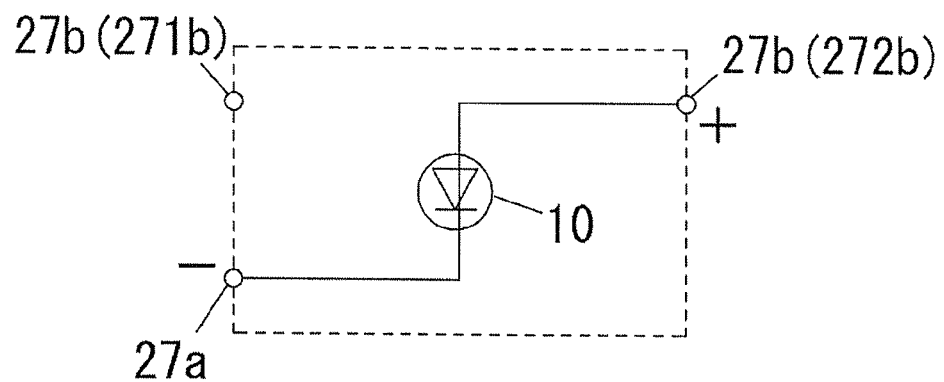
FIG. 6 A shows a circuit diagram indicating a connection relationship between the terminal and the LED chip in the LED unit of the above.
Figure 6:
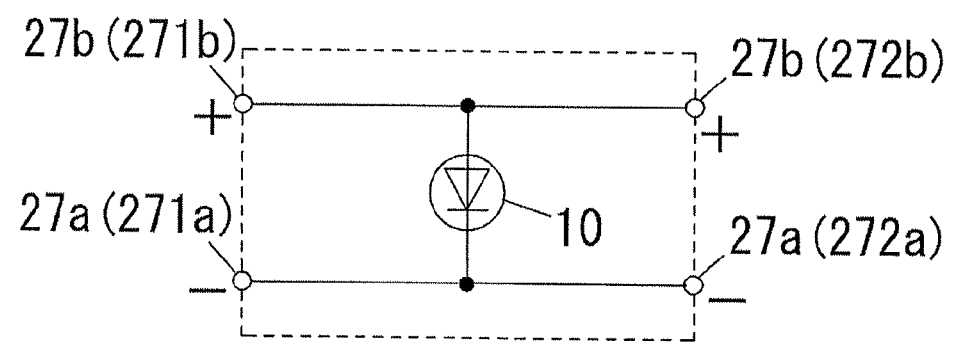

In addition, similar to the first embodiment, also in this embodiment, the number of the negative terminal 27a is not limited to one. Therefore, the LED module may comprise a plurality of the LED modules 1. As mentioned above, when one of the two negative terminals 27a (271a, 271b) is disposed on the left side surface 1a of the LED module 1 to be exposed and the other of the two negative terminals 27a is disposed on the right side surface 1a of the LED module 1 to be exposed, each one of the electrical insulators 30a, 30b are provided their top surfaces with a plurality of the wiring line 50a, 50b. In addition, in the right side of the LED module 1, each the terminal 27a and each the pad 53a are connected with solder. In addition, in the left side of the LED module, each the terminal 27b and each the pad 53b are connected with solder. FIG. 6 B shows the circuit diagram which indicates the connection relationship of "the LED chip 10" and "the terminals 27a (271a, 272a) and the terminals 27b (271b, 272b)"; this connection relationship is established by the above method. In addition, in this embodiment, the LED chip 10 may be arranged such that the anode is located on the top surface and the cathode is located on the bottom surface. Also in this case, the terminal 27a and the pad 53a are connected with the solder. The terminal 27b and the pad 53b are connected with the solder.

Third Embodiment

Figure 7:
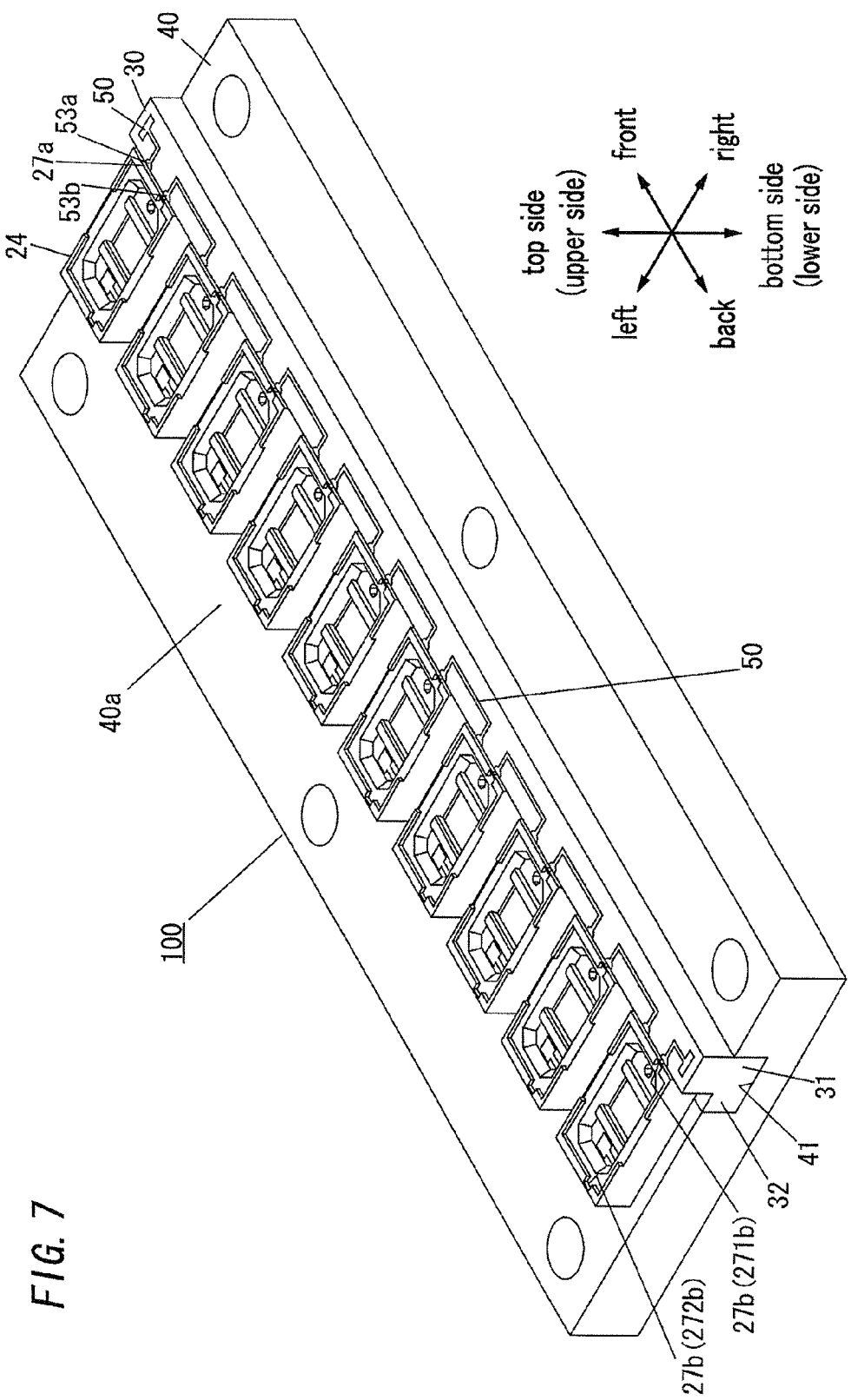
FIG. 7 shows a perspective view indicating the configuration of the LED unit of the third embodiment.
Figure 8:
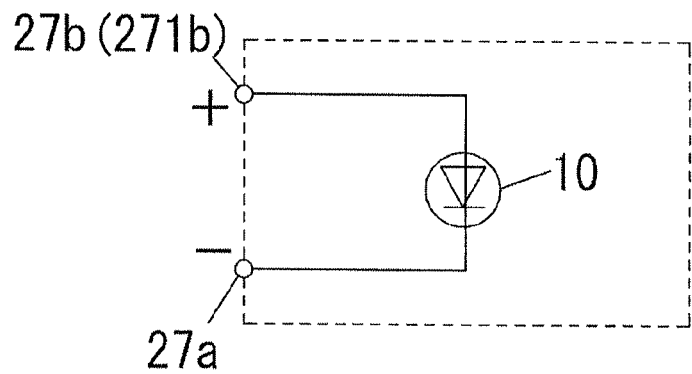
FIG. 8 A shows a circuit diagram indicating the connection relationship between the terminal and the LED chip in the LED unit of the above.
Figure 8:
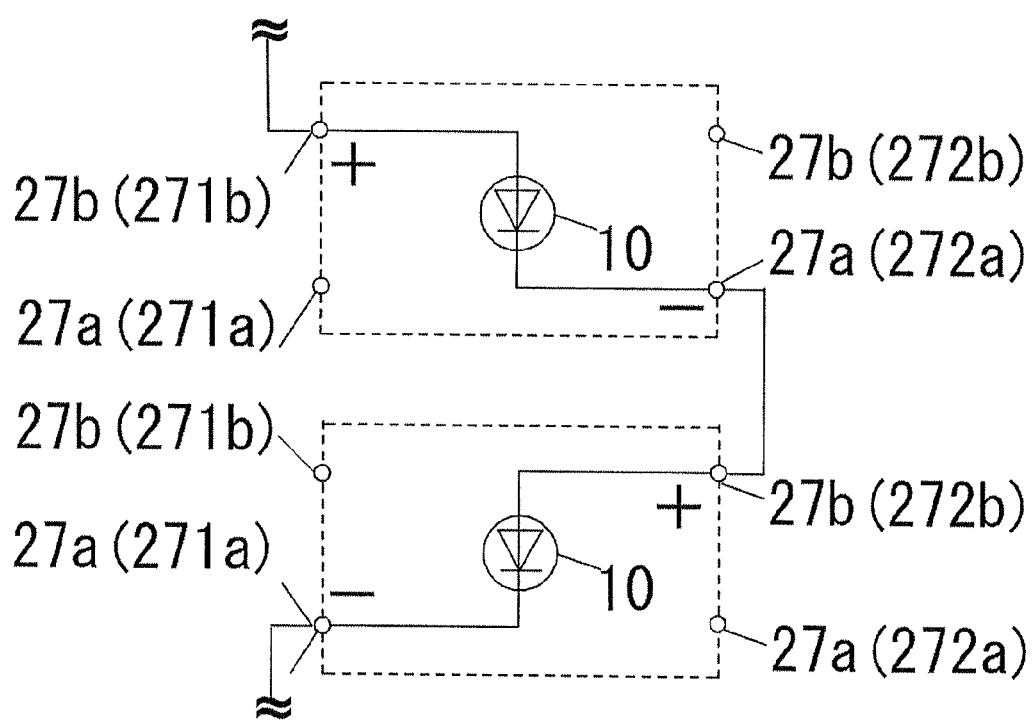

FIG. 7 shows the LED unit 100 of this embodiment, the LED unit 100 of this embodiment has the basic components which are approximately equivalent to the basic component of the first embodiment. Therefore, the components in common with the components of the first embodiment are symbolized by the same reference numerals, whereby their explanations are omitted. The configuration of each the LED module 1 in this embodiment is approximately in common with the first embodiment. This embodiment is different from the first embodiment in the technical feature that the LED modules 1 are connected in series. FIG. 8 A shows the circuit diagram which indicates the connection relationship of the LED chip 10 and the terminals 27a, 27b of the LED unit in this embodiment.

In this embodiment, the patterned circuit 50 is formed to connect a plurality of the LED modules 1 in series, and is provided with pads 53a, 53b, which are connected to each the negative terminal 27a and the positive terminal 27b (271b) with the solder. In addition, each the pad 53 is designed such that each the pad 53 is faced to each the terminal 27 and has the same level (at the same height).

With this configuration, it is possible to easily establish the series connection of a plurality of the LED module 1 by connecting each the terminal 27 to each the pad 53 with a little amount of the solder, without using the bonding wire. Similarly, the extending member 32 of the electrical insulator 30 prevents the solder having the liquid form from flowing to the top surface of the heat radiation plate 40. Consequently, the electrical short is prevented. In addition, similar to the first embodiment, if "there is no possibility of the electrical short of the patterned conductor 26a of the lower side to the heat radiation plate 40", and "there is no possibility of the electrical short due to the solder having the liquid form", there is no need to employ the extending member 32.

In addition, similar to the first embodiment, in this embodiment, the number of the negative terminal 27a of each the LED module 1 is not limited to one. The LED module 1 may comprise a plurality of the negative terminal 27a. When the negative terminals 27a (271a, 272a) are disposed on the left side surface 1a and the right side surface 1b of the LED module 1, respectively, to be exposed, similar to the second embodiment, the heat radiation plate 40 is formed at its top surface with two grooves 41. The two electrical insulators 30 are mounted on the heat radiation plate. In addition, each the electrical insulator 30 is provided at its top surface with the patterned circuit 50. A plurality of the LED modules 1 are connected to have a series connection by connecting each the terminal 27 to each the pad 53 with solder. The series connection is established according to the arrangement shown in FIG. 8 B. That is, in each the LED module 1, both the negative terminal 271a and the positive terminal 272b are connected by solder. Or, both the negative terminal 272a and the positive terminal 271b are connected by solder. Consequently, the electrical connection is established. In addition, also in this embodiment, the LED chip may be mounted such that the anode is located on the top surface and the cathode is located on the bottom surface. In this case, the terminal 27a is connected to the pad 53a with the solder. The terminal 27b is connected to the pad 53b with the solder.

Fourth Embodiment

Figure 9:
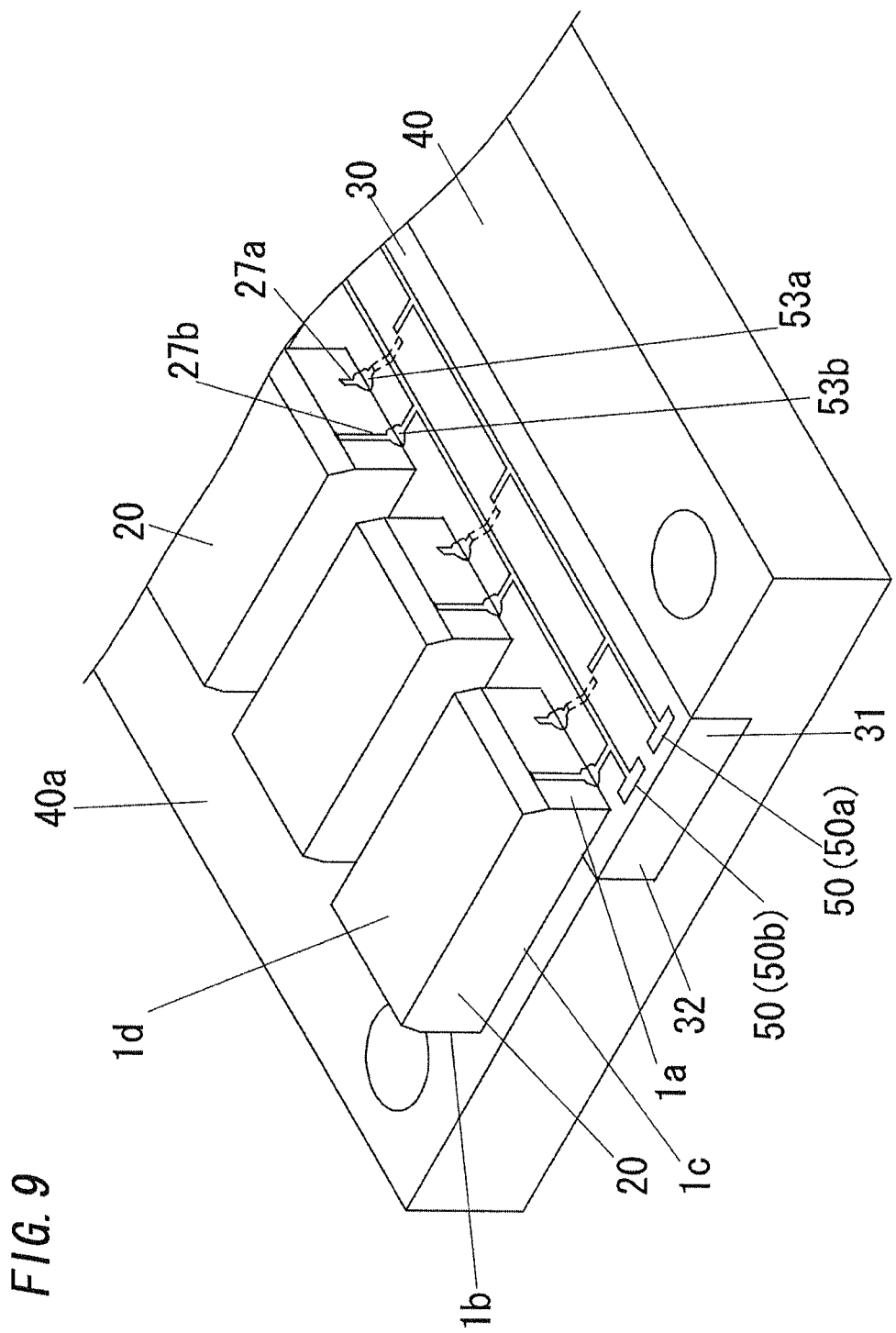
FIG. 9 shows a perspective view indicating the configuration of the LED unit of the fourth embodiment.

FIG. 9 shows the LED unit 100 of this embodiment. The LED unit 100 in this embodiment has the basic components which are approximately in common with the basic components of the first embodiment. Therefore, the components in common with the components of the first embodiment are symbolized by the same reference numerals, and are omitted their explanations. This embodiment is different in the shape of each the terminal 27 and the electrical insulator 30 from the first embodiment.

The electrical insulator 30 in this embodiment has the main member 31 and the extending member 32 each of which has the top surface having the same level (the same height) with respect to each other. The electrical insulator 30 has a cuboid.

Each the negative terminal 27a and each the positive terminal 27b has a strip shape extending in the upper-lower direction. The lower end of each the negative terminal 27a and each the positive terminal 27b has a semicircular shape. In this invention, the shape of each the terminal is not limited thereto. In this embodiment, the terminals 27a, 27b have lower end which has a same level (a same height). Each the positive terminal 27b is longer than each the negative terminal 27a in the upper-lower direction. In addition, the pad 53a and 53b have the same level (the same height) with respect to the terminals 27a, 27b, respectively. Also in this case, it is possible to easily connect each the terminal 27 to each the pad 53 with a little amount of the solder. Therefore, the top surface of the extending member 32 makes it possible to prevent the electrical short caused by the solder having the liquid form.

An explanation of the configuration of this embodiment is made with FIG. 9 when this embodiment employs the basic components in common with that of the first embodiment. However, this embodiment is not limited to the above components. That is to say, the configuration of this embodiment may be employed to a case where the basic components in common with that of the first embodiment, the second embodiment, and the third embodiment.

Fifth Embodiment

Figure 10:
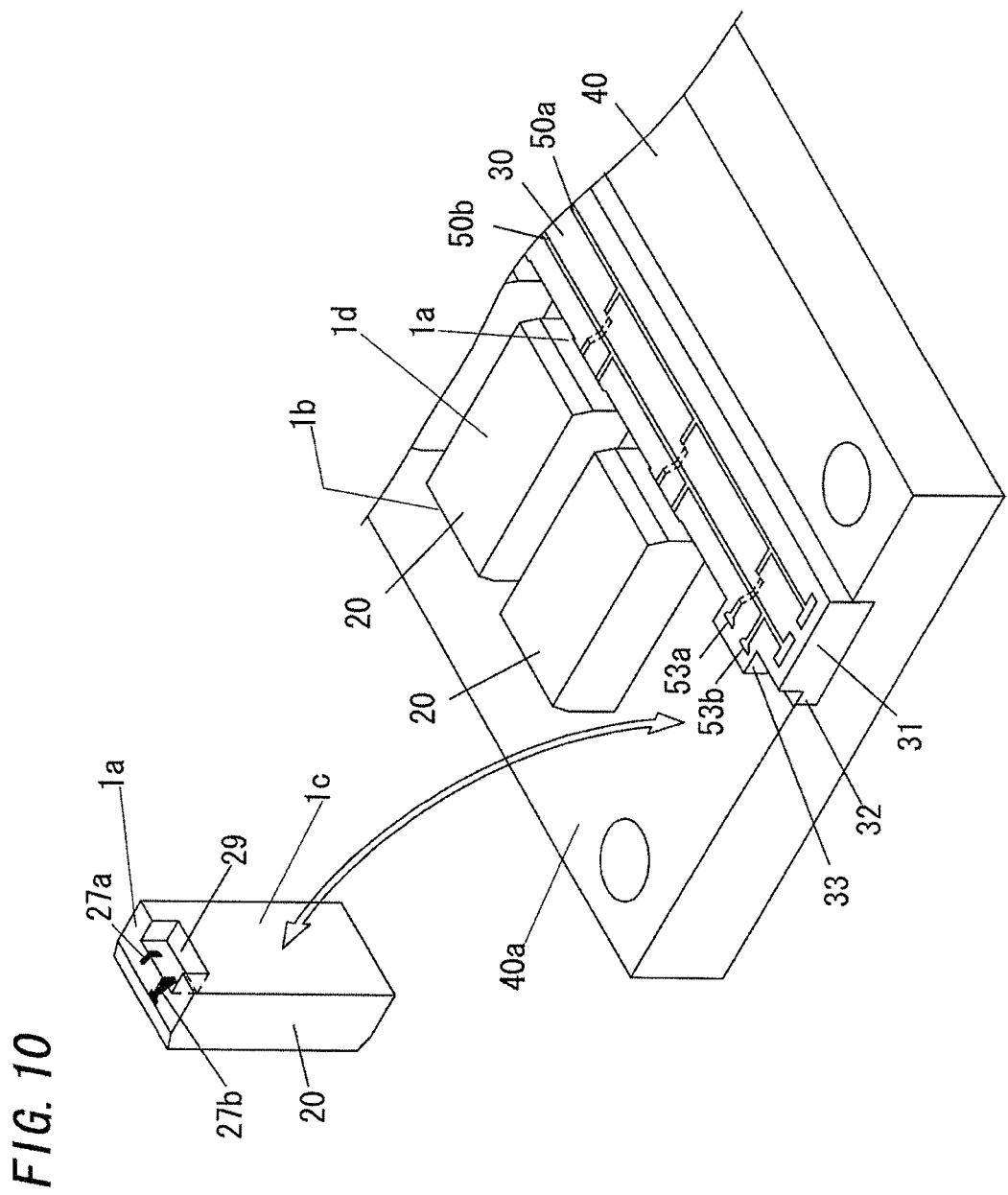
FIG. 10 shows a perspective view indicating the configuration of the LED unit of the fifth embodiment.

FIG. 10 shows the LED unit 100 of this embodiment. The LED unit 100 in this embodiment comprises the basic components which are in common with that of the fourth embodiment. Therefore, the components in common with that of the fourth embodiment are symbolized by the same reference numerals, and are omitted their explanations. This embodiment is different from the fourth embodiment in the shape of each the LED module 1 and the electrical insulator 30.

The electrical insulator 30 has the second surface with an upper portion, and is provided at its upper portion of the second surface with a projection 33. (The second surface is defined by the left side surface of the main member 31.) In addition, each the LED module 1 is provided with the recess 29 which is engaged with the projection 33. In this embodiment, the recess 29 is formed in the bottom surface 1c of the housing 22. This configuration makes it possible to positioning each the LED module 1.

Furthermore, the electrical insulator 30 is provided at a top surface of each the projection 30 with the pad 53. Furthermore, in each the LED module 1, the recess is formed such that the lower side patterned conductor 26a is exposed from the wall surface of the recess 29. The lower side patterned conductor 26a on the wall surface of the recess is defined as a part of the negative terminal 27a. Each the positive terminal 27b extends from the first surface (right side surface) of each the LED module 1 to the top surface of the inside surface of the recess 29. In addition, as will be understood from FIG. 10, in this embodiment, each the negative terminal 27a also extends from the first surface (right side surface) 1a of each the LED module 1 to the top surface of the inside wall of the recess 29. With this configuration, it is possible to connect over a region from the inside wall of the recess 20 to the side surface of the LED module 1 with the solder. Therefore, this configuration makes it possible to improve the connection reliability.

This configuration makes it possible to make a positioning of the LED module 1. In addition, this configuration makes it possible to electrically connect each the terminal 27 to each the pad 53 with a little amount of the solder. In addition, this configuration of the embodiment may be employed to a case where the basic components of the first embodiment, the second embodiment, and the third embodiment are employed.

Sixth Embodiment

Figure 11:
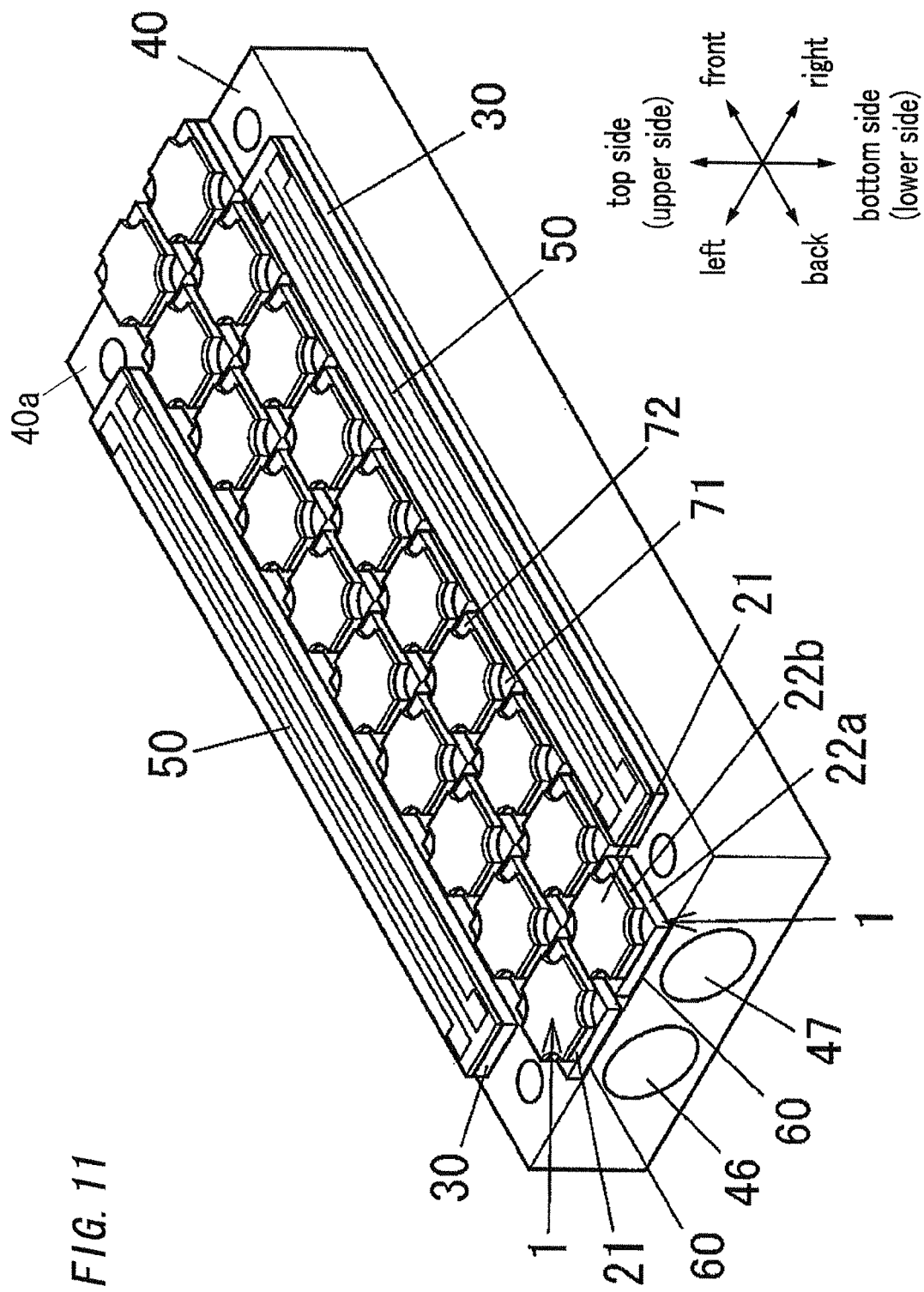
FIG. 11 shows a perspective view indicating the configuration of the LED unit of the sixth embodiment.

The LED unit 100 of this embodiment comprises, as shown in FIG. 11, a plurality of the LED module 1; a plurality of the LED modules 1 are mounted on the top surface (the first surface) 40a of the heat radiation plate 40.

Figure 12:
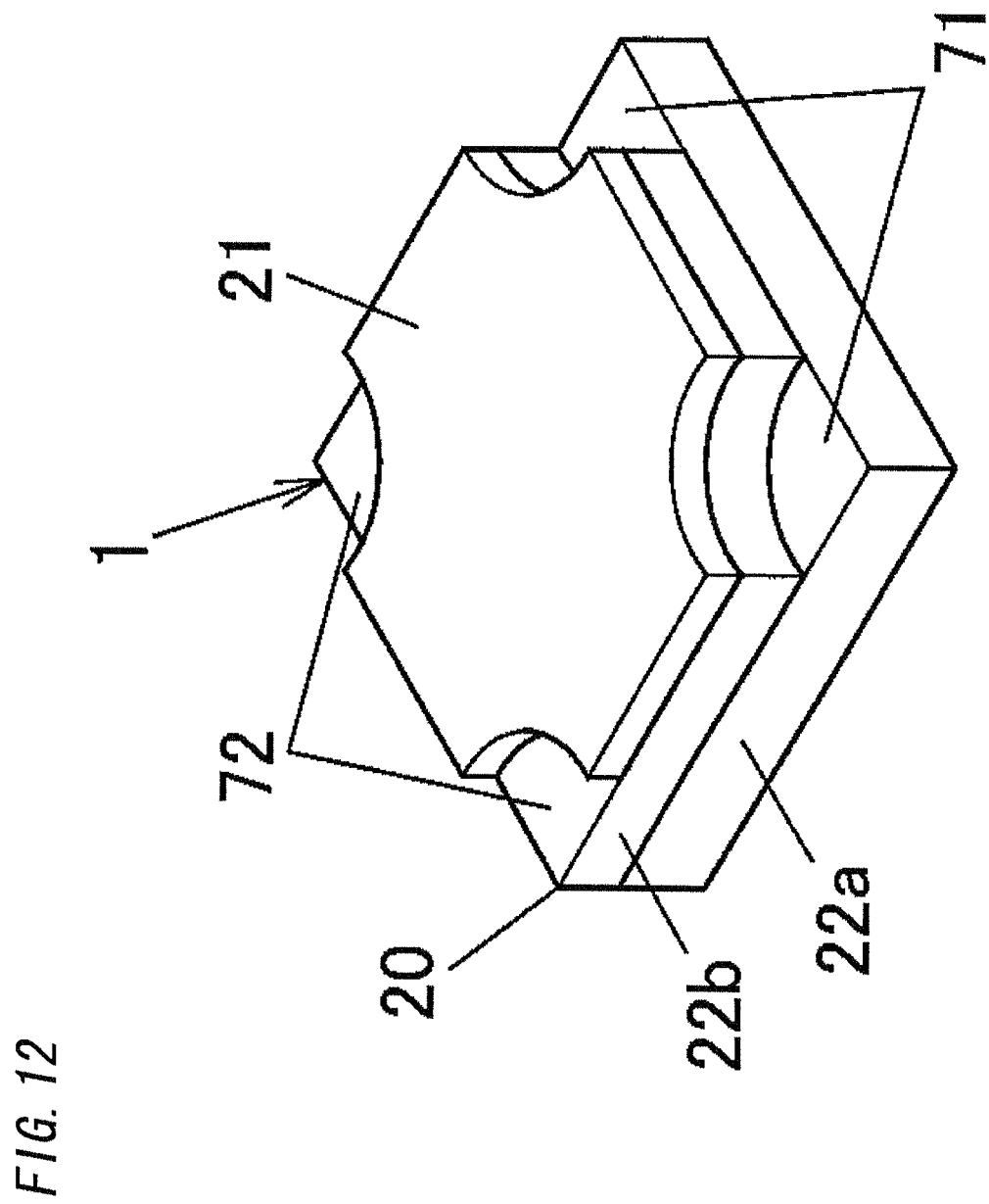
FIG. 12 shows a perspective view indicating the configuration of the LED module of the LED unit of the above.
Figure 13:
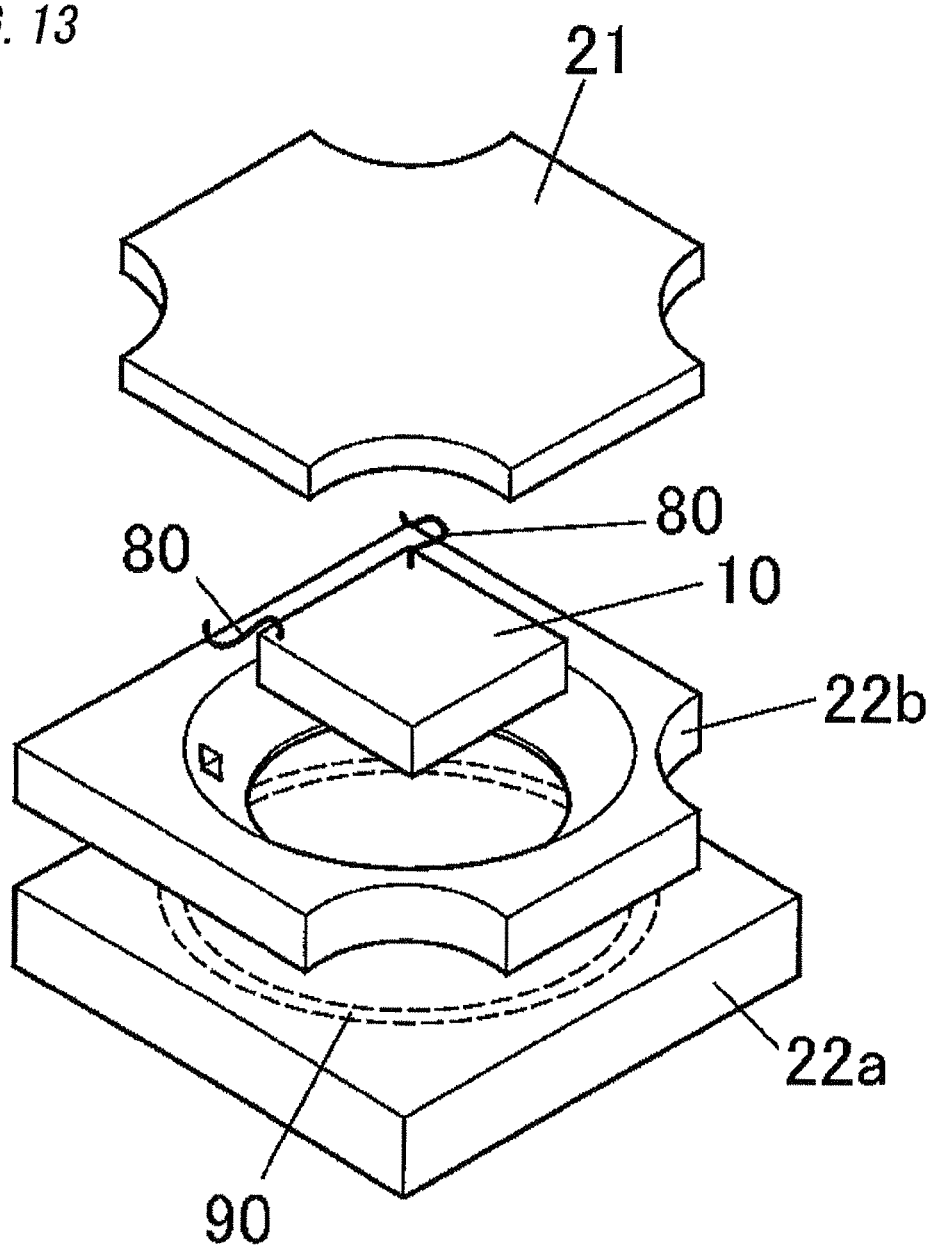
FIG. 13 shows an exploded perspective view indicating the configuration of the LED module in the LED unit of the above.

The LED module 1 is, as shown in FIG. 12 and FIG. 13, comprises the LED chip 10 and the package 20 which is configured to incorporate the LED chip 10 therein. The package 20 comprises the sub-mount substrate 22a, the frame member 22b, and the optical glass 21; the sub-mount substrate 22a is connected at its top surface to the LED chip 10 with AuSn; the frame member 22b is mounted on the top surface of the sub-mount substrate 22a with AuSn so as to surround the LED chip 10; the optical glass 21 is connected the periphery of the circular opening of the frame member 22b with AuSn. The sub-mount substrate 22a is made of AlN (aluminum nitride). Both surfaces of the sub-mount substrate 22a are provided with Au (gold) plating. In addition, the sub-mount substrate 22a has the top surface which is faced to the frame member 22b; the top surface of the sub-mount substrate 22a is provided with AuSn (gold and tin) plating. (Area 90 of the top surface of FIG. 13.) The frame member 22b is made of $Al_2O_3$ (aluminum oxide) which has high heat conductivity relative to the electrical insulation material and which has the coefficient of thermal expansion being close to the coefficient of thermal expansion of AlN. The top surface of the frame member 22b is plated with Au. The frame member 22b has a lower surface which is faced to the sub-mount substrate 22a; the lower surface of the sub-mount substrate 22a is provided with circular shaped AuSn plating. The optical glass 21 has a predetermined portion which is faced to the periphery of the opening of the frame 22b, and is provided at its predetermined portion with circular shaped Au plating. In addition, according to the AuSn plating, "the sub-mount substrate 22a, the frame member 22b, and the optical glass 21" are coupled to each other with AuSn.

The LED chip 10 is, for example, realized by the ultraviolet LED chip being configured to emit the light having a peak wavelength in ultraviolet region. The anode of the LED chip 10 is provided with a wire 80. The LED chip 10 is connected to the Au plating of the top surface of the sub-mount substrate 22a (or the frame member 22b) with die bond. The cathode of the LED chip 10 is also provided with a wire 80. The LED chip 10 is connected to the Au plating on the top surface of the frame 22b (or the sub-mount substrate 22a) with wire bonding. That is, the anode of the LED chip 10 is electrically connected to a portion (anode 71) corresponding to the Au plating on the top surface of the sub-mount substrate 22a. The cathode of the LED chip 10 is electrically connected to a portion (cathode 72) corresponding to the Au plating on the top surface of the frame member 22b. Therefore, the anode 71 and the cathode 72 are provided as the upper layer and the lower layer of the package. Consequently, this configuration makes it possible to compactify the package 20. It is noted that the anode of the LED chip 10 may be electrically connected to the portion corresponding to the Au plating on the top surface of the frame member 22b. In this case, the cathode of the LED chip 10 is connected to the portion corresponding to the Au plating on the top surface of the sub-mount substrate 22a. Furthermore, this embodiment exemplifies the ultraviolet LED chip as the LED chip 10. However, the LED chip 10 is not limited to the ultraviolet LED chip.

By the way, the sub-mount substrate 22a is made of AlN having the coefficient of linear expansion approximately equal to the coefficient of linear expansion of the LED chip 10. The sub-mount substrate 22a is interposed between the LED chip 10 and the heat radiation plate 40. Although the stress caused by the difference of the coefficient of the thermal expansions between the LED chip 10 and the heat radiation plate 40 is applied to the LED chip 10, the sub-mount substrate 22a is configured to reduce the stress. In addition, the sub-mount substrate is configured to spread the heat in the LED chip to the lateral direction of the sub-mount substrate. In addition, the sub-mount substrate has a property of spreading the heat in the vertical direction of the sub-mount substrate. Therefore, the sub-mount member is reduced its thermal resistance.

The heat radiation plate 40 is realized by the copper plate having cuboid. The heat radiation plate 40 acts as the supporting base which has a first surface (top surface) for mounting the LED modules 1 in two rows along the longitudinal direction of the heat radiation plate. The heat radiation plate 40 is provided at its inside with a plurality of the flow paths 46, 47 for passing the cooling medium for cooling the LED chip. (In the illustration, the heat radiation plate 40 is provided with two flow paths.) Each the flow path 46 and 47 is shaped to have a cylindrical shape. The lengthwise directions of the flow paths 46, 47 extend in the same direction. The flow paths 46, 47 are provided to the heat radiation plate 40 such that the flow paths 46, 47 are spaced in a direction perpendicular to the lengthwise direction (the short side direction of the heat radiation plate 2) from each other. The flow paths 46, 47 extend in parallel with each other. The cooling medium which flows in the flow paths 46, 47 are realized by medium such as the water and a silicone region which are well known. In addition, the embodiment of mounting the LED module 1 on the top surface of the heat radiation plate 402 is not limited to the configuration of arranging in two rows along the longitudinal direction. Therefore, it is possible to arrange the LED modules 1 in one row, three rows or more.

Figure 14:
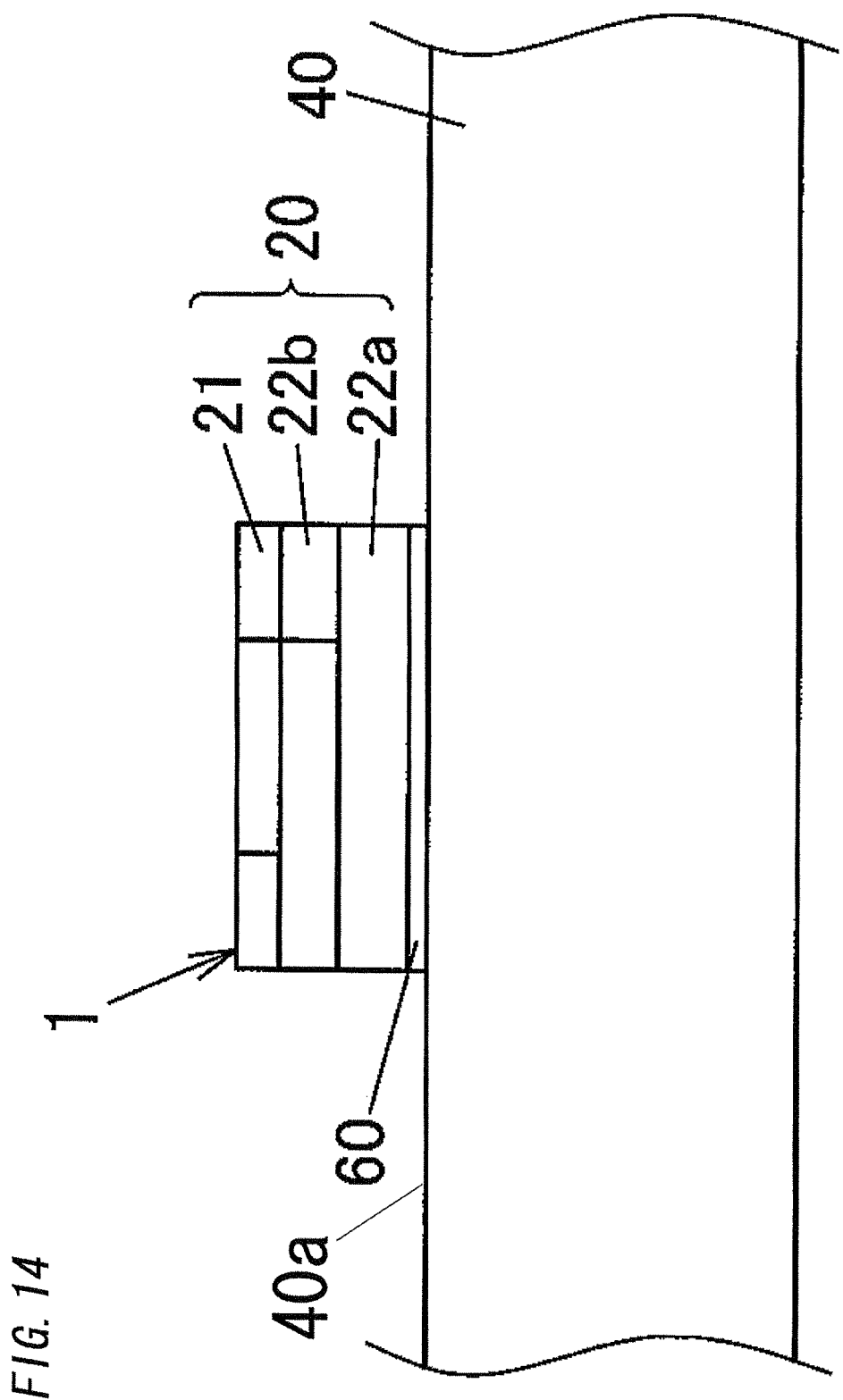
FIG. 14 shows a side cross sectional view indicating a main configuration of the LED unit of the above.

When the LED modules 1 in this embodiment are attached to the heat radiation plate 40, as shown in FIG. 14, the lower surface of the sub-mount substrate 22a of the LED module 1 is directly connected to the top surface 40a of the heat radiation plate 40 with the solder 60. Therefore, there is no need to form the screw hole to the LED module 1, compared with the configuration of fixing the LED module with the screw. Therefore, this configuration makes it possible to downsize the LED module 1 to achieve the high-density packaging.

In addition, as the means for coupling the sub-mount substrate 22a of the LED module 1 to the heat radiation plate 40, it is possible to employ the adhesive agent having the heat conductivity, other than the connection with the solder. The adhesive agent having the heat conductivity is such as the electrical conductive adhesive agent which comprises "the resin such as epoxy resin having a fixing property" mixed with "the metal (electrical conductive filler) such as silver having the electrical conductivity". In addition, the adhesive agent having the heat conductivity is such as the electrical insulation adhesive agent which is made of high electrical insulation property and which has high heat conductivity.

In addition, the heat radiation plate 40 is provided with the flow paths 46, 47. The heat generated in the LED module 1 is transferred to the cooling medium which passes through the flow paths 46, 47 via the heat radiation plate 40. The lower surface of the sub-mount substrate 22a is electrically insulated from the anode 71 and the cathode 72. Therefore, the heat radiation path is established its electrical insulation property. In addition, the sub-mount substrate 22a is provided at its both surfaces with the Au plating. Therefore, According to the Au plating and the heat spreading property of the sub-mount substrate 22a make it possible to improve the heat radiation property.

By the way, the cooling medium absorbs the heat when the cooling medium passes the flow paths 46, 47. Therefore, the temperature of the cooling medium before the cooling medium passes through the flow paths 46, 47 is lower than the temperature of the cooling medium after the cooling medium passes through the flow paths 46, 47. Therefore, an inlet for the cooling medium of the flow path has a high cooling efficiency, relatively. An outlet for the cooling medium of the flow path has a low cooling efficiency, relatively. As a result, the luminescent efficiency of the LED chip 10 becomes less towards the outlet for the cooling medium of the flow path.

Therefore, in this embodiment, the cooling medium is supplied to the flow path 46 from one end in the lengthwise direction (right side In FIG. 11) of the heat radiation plate 40, and is supplied to the flow path 47 from remaining one end in the lengthwise direction (left side In FIG. 11) of the heat radiation. According to this configuration, "the flowing direction of the cooling medium in the flow path 46" and "the flowing direction of the cooling medium in the flow path 47 adjacent to the flow path 46" are opposite to each other.

According to this configuration, in the flow path 46, the temperature of the cooling medium of one end in the lengthwise direction is lower than the temperature of the cooling medium of the remaining end in the lengthwise direction. In addition, in the flow path 47, the temperature of the cooling medium of the remaining end in the lengthwise direction is lower than the temperature of the cooling medium of one end in the lengthwise direction. Consequently, it is possible to uniform the distribution of temperature of an entire of the heat radiation plate 40. Therefore, it is possible to prevent the unevenness of the distribution of the temperature of the heat radiation plate 40 caused by the fact that the temperature of the cooling medium in the outlet becomes higher than that in the inlet. Therefore, it is possible to prevent the difference of the brightness of the light emitted from the LED chips 10 of the LED modules 1. In addition, the number of the flow paths in this embodiment is one example. Therefore, it is possible to employ more than two flow path.

In addition, the top surface 40a of the heat radiation plate 40 is provided with a pair of the electrical insulator; the electrical insulators extend along both outside edges in the lengthwise direction. The electrical insulator 30 is provided at its top surface with the patterned circuit 50. The patterned circuit 50 is connected to the positive wiring and negative wiring from the direct current power source which is not shown in the illustration. The anode 71 and the cathode 72 of the package 20 of each the LED module 1 are connected to the positive terminal and the negative terminal of the patterned circuit with the wires, respectively. Consequently, a plurality of the LED module 1 is connected in parallel with the direct current power source. In FIG. 11, the LED module 1 is arranged such that the anode 71 and the cathode 72 of the package 20 are exposed to the longitudinal direction of the heat radiation plate 40. Consequently, the LED modules 1 are arranged to be suitable for establishing the parallel connection. In addition, a plurality of the LED module 1 may be arranged to have a series connection with respect to the direct current power source. In addition, the patterned circuit 50 of the electrical insulator 30 may have the electronic components such as zener diode and capacitor, as need.

As mentioned above, it is possible to mount the LED module 1 and the electrical insulator 30 on the top surface of the heat radiation plate 40. Therefore, it is possible to easily connect the LED module to the power source. Therefore, it is possible to improve the workability.

Seventh Embodiment

Figure 15:
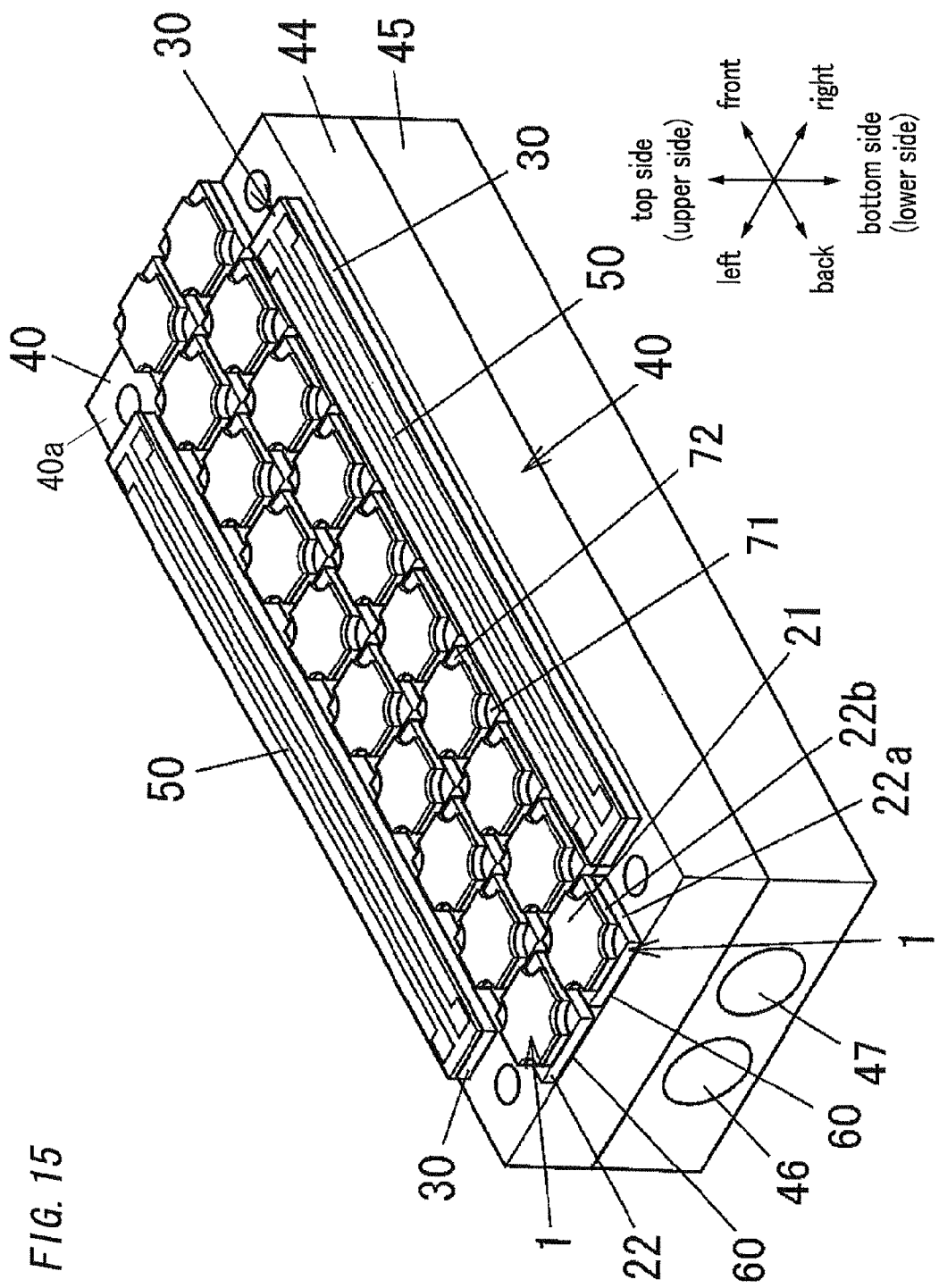
FIG. 15 shows a perspective view indicating the configuration of the LED unit of the seventh embodiment.

The LED unit in this embodiment is shown in FIG. 15, the LED unit comprises the heat radiation plate 40 which is realized by the two blocks; one of the two blocks is the mounting base 44, and the remaining one of the two blocks is the pedestal 45 which is separatable from the mounting base 44. The mounting base 44 has a top surface which is defined as the mounting surface 20 which is coupled to a plurality of the LED modules 1. The mounting base 44 has a bottom surface which is faced to the top surface of the pedestal 45. Consequently, the mounting base 44 is detachably attached to the pedestal 45. The pedestal 45 is provided at its inside portion with a plurality of the flow paths 46, 47 for passing the cooling medium of the LED chip, similar to the sixth embodiment. (In the illustration, the two flow paths are provided to the mounting base 44.) In addition, "the lower surface of the mounting base 44" and "the top surface of the pedestal 45" have small roughness degrees. In addition, the mounting base 44 is fixed to the pedestal 45 by a means such as screw such that the bottom surface of the mounting base 44 is attached firmly to the top surface of the pedestal 45. Consequently, the thermal resistivity between the mounting base 44 and the pedestal 45 is reduced.

In this manner, the heat radiation plate 40 is divided into components. Consequently, when the necessary of changing the LED module 1 due to the lifetime or the breakage, it is possible to change only the mounting base 44 independent from the pedestal 45. Consequently, it is possible to change the LED module 1, independent from the pedestal 45. Therefore, there is no need to rearrange the flow paths 46, 47. Therefore, it is possible to easily replace the mounting base 44. Furthermore, it is possible to increase the heat capacity of the pedestal 45. Therefore, it is possible to reduce the heat capacity of the mounting base 44. Therefore, in a case where the LED modules 1 are mounted on the top surface of the mounting base 44 with the solder or the adhesive agent having the heat conductivity, it is possible to reduce the size of the heat source for the solder or the size of the heat source for curing the adhesive agent having the heat conductivity. Therefore, it is possible to perform the connection process, easily and speedy.

In addition, the pedestal 45 is independent from the mounting base 44. Therefore, it is possible to improve the heat diffusion property of immediately diffusing the heat in the LED chip 10 to the lateral direction and to the vertical direction In addition, the LED units 100 shown in the above embodiments are, for example, used as the lighting device with the LED chip (ultraviolet LED chip) which is configured to emit the ultraviolet. (The lighting device is such as ultraviolet curing device.) Such a lighting device is used as the printing system for curing the ultraviolet curable material having a property of being cured by receiving the ultraviolet, such as ink having the ultraviolet curable property.

The invention claimed is:
1. An LED unit comprising:
a plurality of LED modules; and
a heat radiation plate, wherein:
each of said plurality of LED modules comprises an LED chip and a package, said package being configured to incorporate said LED chip therein, said package having an electrical insulation property,
each said package includes a sub-mount member having a heat conductivity, said sub-mount member being located between said LED chip and said heat radiation plate, said sub-mount members being integrally formed with each other,
said plurality of LED modules are arranged on a first surface of said heat radiation plate,
each of said plurality of LED modules is provided at its outer surface with a positive terminal and a negative terminal which are electrically coupled to an anode and a cathode of said LED chip, respectively,
said heat radiation plate is provided at its first surface with an electrical insulator which is located adjacent to said plurality of LED modules,
said electrical insulator comprises a main member and an extending member, said main member of the electrical insulator having a top surface and being provided at its top surface with a patterned circuit,
said patterned circuit is configured to connect said plurality of LED modules to each other,
said patterned circuit is provided with a plurality of pads which are coupled to said terminals of each of the plurality of LED modules by a solder,
each of said LED modules is provided with said positive terminal and said negative terminal at least one of which is provided in a plural number,
said heat radiation plate is provided at its top surface with a groove which extends in a first direction, said groove being formed such that the electrical insulator is disposed within the groove,
said extending member is formed to project from a side surface of the main member,
said extending member has a top surface and is configured to mount a first end portion of a third surface of each the LED module, and
a remaining part of each of the plurality of LED modules is directly mounted on the heat radiation plate.
2. The LED unit as set forth in claim 1, wherein
said positive terminal and said negative terminal are formed on a first surface of said each of said plurality of LED modules.
3. The LED unit as set forth in claim 1, wherein:
said positive terminal is formed on a first surface of said each of said plurality of LED modules, and
said negative terminal is formed on a second surface of said each of said plurality of LED modules.
4. The LED unit as set forth in claim 1, wherein
said patterned circuit is formed to connect the plurality of LED modules in parallel.

5. The LED unit as set forth in claim 1, wherein
said patterned circuit is formed to connect the plurality of LED modules in series.

6. The LED unit as set forth in claim 1, wherein:
said electrical insulator is realized by the electrical insulators which are paired,
said electrical insulators are disposed on the first surface of said heat radiation plate such that said electrical insulators are spaced from each other,
said plurality of LED modules are disposed between said electrical insulators which are paired, and
each said electrical insulator is provided at its first surface with said patterned circuit.

7. The LED unit as set forth in claim 1, wherein:
said patterned circuit comprises a plurality of wiring lines extending along a direction of a long side of said first surface of said electrical insulator, and
the plurality of LED modules are electrically connected to said wiring lines through said positive terminal and said negative terminal.

8. The LED unit as set forth in claim 7, wherein:
a plurality of said wiring lines comprise a wiring line of positive side and a wiring line of negative side,
said wiring line of positive side is connected to said positive terminal of each of said LED modules, and
said wiring line of negative side is connected to said negative terminal of each of said LED modules.

9. The LED unit as set forth in claim 8, wherein
said wiring line of positive side and said wiring line of negative side are formed on said electrical insulator which is single.

10. The LED unit as set forth in claim 8, wherein:
said electrical insulator is a pair of the electrical insulators,
said electrical insulators is disposed on said first surface of said heat radiation plate such that said electrical insulators are spaced from each other,
said plurality of LED modules are disposed between said electrical insulators which are paired, and
said wiring line of positive side and said wiring line of negative side are formed to said electrical insulators being paired, respectively.

11. The LED unit as set forth in claim 1, wherein
a part of said patterned circuit is disposed in an inside of said electrical insulator.

12. The LED unit as set forth in claim 1, wherein
said each of said plurality of LED modules comprises said positive terminal and said negative terminal which are positioned on the same level as said pads.

13. The LED unit as set forth in claim 1, wherein:
said electrical insulator is provided at its second surface with a projection which is shaped to project toward said plurality of LED modules, and
each of said LED modules is provided with a recess that is engaged with said projection.

14. The LED unit as set forth in claim 13, wherein:
each of said plurality of pads is provided on the projection, and
said positive and negative terminals are exposed to a wall surface of said recess.

15. The LED unit as set forth in claim 1, wherein:
each of said plurality of LED modules has a fourth surface which is configured to pass light emitted from said LED chip, and
the plurality of LED modules are arranged in a short side of said fourth surface of said each of said plurality of LED module modules.

16. The LED unit as set forth in claim 1, wherein
each of said plurality of LED modules is coupled to said first surface of said heat radiation plate by a braze or an adhesive agent having a heat conductivity.

17. The LED unit as set forth in claim 1, wherein:
said heat radiation plate is provided with a mounting base and a pedestal,
said mounting base is configured to mount the plurality of LED modules, and
said pedestal is detachably attached to said mounting base.

18. The LED unit as set forth in claim 1, wherein:
said heat radiation plate is provided at its first surface with an electrical insulation plate which is formed with a patterned circuit, and
said patterned circuit is connected with said plurality of LED modules through wirings.

* * * * *